(12) United States Patent
Jung et al.

(10) Patent No.: US 11,227,912 B2
(45) Date of Patent: Jan. 18, 2022

(54) INTEGRATED CIRCUIT DEVICE AND METHOD OF MANUFACTURING THE SAME

(71) Applicant: SAMSUNG ELECTRONICS CO., LTD., Suwon-si (KR)

(72) Inventors: Kyooho Jung, Seoul (KR); Jeonggyu Song, Seongnam (KR); Younsoo Kim, Yongin (KR); Jooho Lee, Hwaseong (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 10 days.

(21) Appl. No.: 16/730,290

(22) Filed: Dec. 30, 2019

(65) Prior Publication Data
US 2020/0395436 A1  Dec. 17, 2020

(30) Foreign Application Priority Data

Jun. 11, 2019 (KR) .................. 10-2019-0068801

(51) Int. Cl.
| | | |
|---|---|---|
| *H01L 29/40* | (2006.01) | |
| *H01L 21/44* | (2006.01) | |
| *H01L 49/02* | (2006.01) | |
| *H01L 21/285* | (2006.01) | |
| *H01L 27/108* | (2006.01) | |

(52) U.S. Cl.
CPC ........ *H01L 28/60* (2013.01); *H01L 21/28556* (2013.01); *H01L 27/10814* (2013.01)

(58) Field of Classification Search
CPC ......... H01L 28/65; H01L 28/75; H01L 28/87; H01L 2924/01041; H01L 2224/05179

USPC ............... 438/386–387, 393, 396, 685–686; 257/298–313, 761–770
See application file for complete search history.

(56) References Cited

U.S. PATENT DOCUMENTS

| | | | |
|---|---|---|---|
| 6,980,416 B2 * | 12/2005 | Sakaguchi ............ | H01G 9/028 361/523 |
| 8,581,318 B1 | 11/2013 | Chen et al. | |
| 8,647,943 B2 * | 2/2014 | Chen ....................... | H01L 28/60 438/240 |
| 8,652,927 B2 | 2/2014 | Malhotra et al. | |
| 8,835,274 B2 | 9/2014 | Hu | |
| 8,896,097 B2 | 11/2014 | Wamura et al. | |
| 9,105,646 B2 | 8/2015 | Malhotra et al. | |
| 9,646,820 B2 | 5/2017 | Pore et al. | |
| 2008/0182427 A1 * | 7/2008 | Oberbeck ......... | H01L 21/31641 438/785 |
| 2016/0093625 A1 * | 3/2016 | Rui ........................ | H01L 28/75 257/532 |
| 2018/0094970 A1 | 4/2018 | Schneider et al. | |
| 2018/0112262 A1 | 4/2018 | Thornton et al. | |
| 2018/0158688 A1 | 6/2018 | Chen et al. | |
| 2020/0058731 A1 * | 2/2020 | Mun ...................... | H01L 28/75 |
| 2020/0286985 A1 * | 9/2020 | Lim ....................... | H01L 28/56 |

FOREIGN PATENT DOCUMENTS

| | | |
|---|---|---|
| JP | 2012-134311 A | 7/2012 |
| KR | 10-2008-0098822 A | 11/2008 |

* cited by examiner

*Primary Examiner* — Calvin Lee
(74) *Attorney, Agent, or Firm* — Lee IP Law, PC

(57) ABSTRACT

An integrated circuit device includes a lower electrode including a niobium (Nb)-containing layer doped with titanium (Ti), a dielectric layer on the lower electrode, and an upper electrode that covers the dielectric layer.

13 Claims, 33 Drawing Sheets

INTEGRATED CIRCUIT DEVICE AND METHOD OF MANUFACTURING THE SAME

CROSS-REFERENCE TO RELATED APPLICATION

Korean Patent Application No. 10-2019-0068801, filed on Jun. 11, 2019, in the Korean Intellectual Property Office, and entitled: "Integrated Circuit Device and Method of Manufacturing the Same," is incorporated by reference herein in its entirety.

BACKGROUND

1. Field

Embodiments relate to an integrated circuit device and a method of manufacturing the same.

2. Description of the Related Art

As an integrated circuit device is down-scaled, a space occupied by a capacitor may be reduced.

SUMMARY

Embodiments are directed to an integrated circuit device, including a lower electrode including a niobium (Nb)-containing layer doped with titanium (Ti), a dielectric layer on the lower electrode, and an upper electrode that covers the dielectric layer.

Embodiments are also directed to an integrated circuit device, including a substrate including an active region, a conductive region on the active region, and a capacitor on the conductive region, the capacitor including a lower electrode including a Nb containing layer doped with Ti, a dielectric layer formed on the lower electrode, and an upper electrode that covers the dielectric layer.

Embodiments are also directed to an integrated circuit device, including a substrate including an active region, a conductive formed on the active region, and a capacitor on the conductive region, the capacitor including a lower electrode including at least one selected from a Nb nitride layer doped with Ti, a Nb oxide layer doped with Ti, and a Nb oxynitride layer doped with Ti, a dielectric layer on the lower electrode and including a metal oxide layer, and an upper electrode that covers the dielectric layer.

Embodiments are also directed to a method of manufacturing an integrated circuit device, the method including forming a lower electrode including a Nb containing layer doped with Ti on a substrate, forming a dielectric layer on the lower electrode, and forming an upper electrode on the dielectric layer.

BRIEF DESCRIPTION OF THE DRAWINGS

Features will become apparent to those of skill in the art by describing in detail example embodiments with reference to the attached drawings in which.

DETAILED DESCRIPTION

Figure 1:
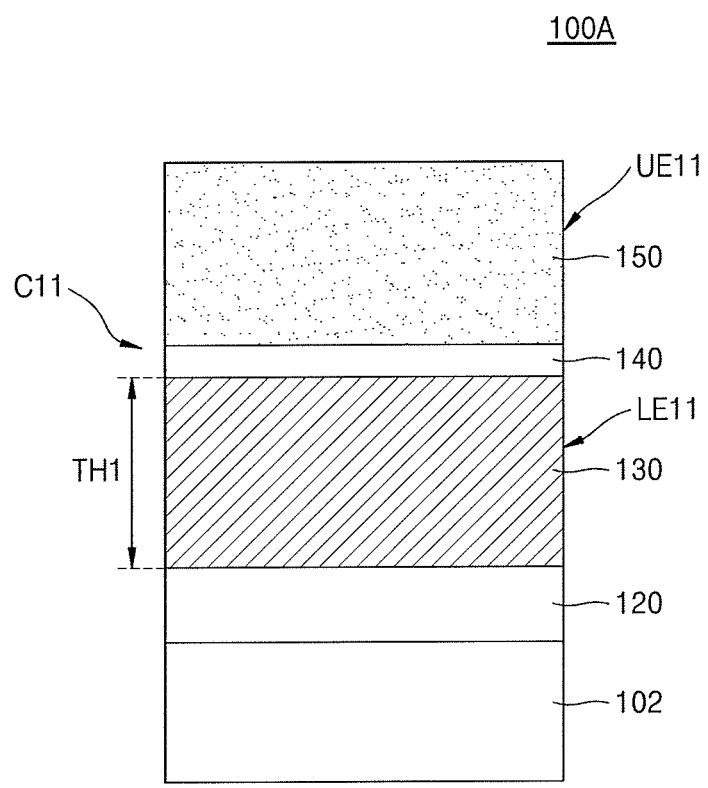
FIG. 1 illustrates a cross-sectional view of a main configuration of an integrated circuit device according to an example embodiment.

FIG. 1 is a cross-sectional view of a main configuration of an integrated circuit device 100A according to an example embodiment.

Referring to FIG. 1, the integrated circuit device 100A includes a substrate 102, a lower structure 120 formed on the substrate 102, and a capacitor C11 formed on the lower structure 120.

The substrate 102 may include a semiconductor element such as silicon (Si) or germanium (Ge) or a compound semiconductor such as SiC, GaAs, InAs, or InP. The substrate 102 may include structures including a semiconductor substrate, at least one insulating layer formed on the semiconductor substrate, or at least one conductive region. The conductive region may be formed of, for example, a well that is doped with impurities or a structure doped with impurities. In example embodiments, the substrate 102 may have various device isolation structures such as a shallow trench isolation (STI) structure.

In an example embodiment, the lower structure 120 may include an insulating layer. In other example embodiments, the lower structure 120 may include various conductive regions, for example, a wiring line layer, a contact plug, and a transistor and an insulating layer for insulating the conductive regions from each other.

The capacitor C11 may include a lower electrode LE11 and an upper electrode UE11 that face each other, and a dielectric layer 140 between the lower electrode LE11 and the upper electrode UE11. The lower electrode LE11 may include a main lower electrode layer 130. A top surface of the main lower electrode layer 130 may contact a bottom surface of the dielectric layer 140.

In an example embodiment, the main lower electrode layer 130 may be formed of a niobium (Nb)-containing layer doped with titanium (Ti). In an example embodiment, the main lower electrode layer 130 may include a Nb nitride layer doped with Ti (hereinafter, referred to as "a NbN layer doped with Ti"). A content ratio of to a Ti atom to a Nb atom in the NbN layer doped with Ti may be 9:1 to 1:99. If the content ratio of the Nb atom is too small in the main lower electrode layer 130, it may be difficult to secure conductivity required by the lower electrode LE11. If the content ratio of the Nb atom is too large in the main lower electrode layer 130, it may have a negative effect on the electrical characteristics required by the capacitor C11.

In other example embodiments, the main lower electrode layer 130 may include the NbN layer including a plurality of kinds of dopants. The plurality of kinds of dopants may include a first dopant formed of Ti and a second dopant formed of at least one of cobalt (Co), tin (Sn), vanadium (V), tantalum (Ta), dubnium (Db), phosphor (P), arsenic (As), antimony (Sb), and bismuth (Bi). In the main lower electrode layer 130, a content ratio of the first dopant to the Nb atom may be in a range of 9:1 to 1:99. In the main lower electrode layer 130, an atomic ratio of the second dopant to the Nb atom may be about 0.01 to about 0.15.

The main lower electrode layer 130 may have a thickness TH1 of about 5 nm to about 30 nm.

The dielectric layer 140 may include a high dielectric layer. The term "high dielectric layer" in the current specification means a dielectric layer having a dielectric constant greater than that of a silicon oxide layer. In an example embodiment, the dielectric layer 140 may be formed of a metal oxide including at least one metal of hafnium (Hf), zirconium (Zr), aluminum (Al), Nb, cerium (Ce), lanthanum (La), Ta, and Ti. In an example embodiment, the dielectric layer 140 may have a single layer structure including one high dielectric layer. In other example embodiments, the dielectric layer 140 may have a multilayer structure including a plurality of high dielectric layers. The high dielectric layer may be one of an $HfO_2$ layer, a $ZrO_2$ layer, an $Al_2O_3$ layer, a $CeO_2$ layer, a $La_2O_3$ layer, a $Ta_2O_3$ layer, and a $TiO_2$ layer. In an example embodiment, the dielectric layer 140 may have a thickness of about 20 Å to about 50 Å.

The upper electrode UE11 may face the lower electrode LE11 with the dielectric layer 140 therebetween. The upper electrode UE11 may include an upper electrode layer 150. The upper electrode layer 150 may be formed of a metal, a metal nitride, a metal oxide, or a combination of the above metals. For example, the upper electrode UE11 may be formed of TiN, MoN, CoN, TaN, TiAlN, TaAlN, W, Ru, $RuO_2$, $SrRuO_3$, Ir, $IrO_2$, Pt, PtO, SRO ($SrRuO_3$), BSRO (($Ba,Sr)RuO_3$), CRO ($CaRuO_3$), LSCO (($La,Sr)CoO_3$), or a combination of the above metals.

Figure 2:
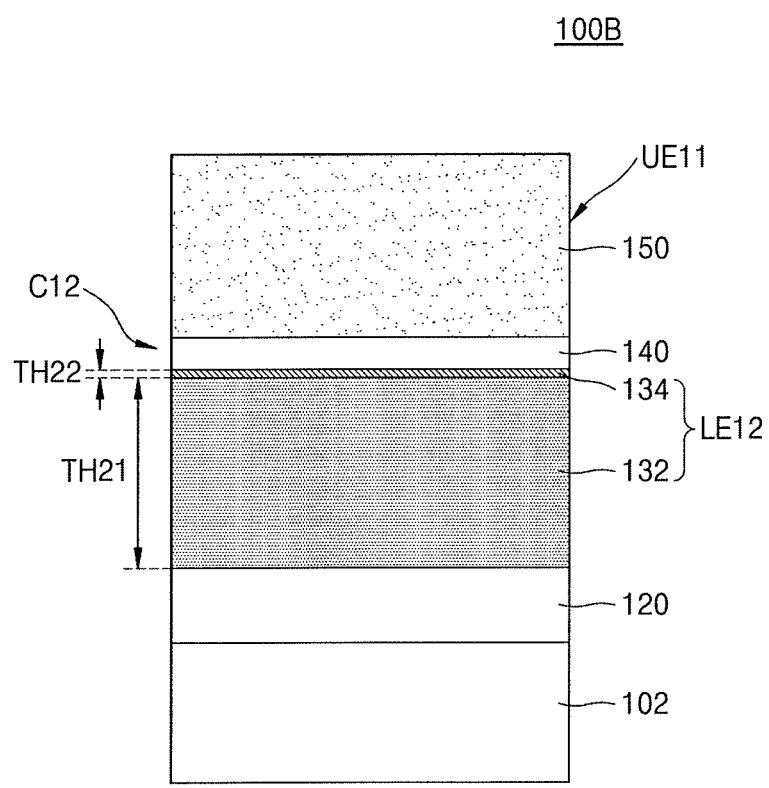
FIG. 2 illustrates a cross-sectional view of a main configuration of an integrated circuit device according to an example embodiment.

FIG. 2 is a cross-sectional view of a main configuration of an integrated circuit device 100B according to an example embodiment. In FIG. 2, the same reference numerals as those of FIG. 1 denote the same members and detailed description thereof is omitted.

Referring to FIG. 2, the integrated circuit device 100B includes a capacitor C12. The capacitor C12 has a similar configuration to that of the capacitor C11 illustrated in FIG. 1. The capacitor C12 includes a lower electrode LE12, the upper electrode UE11, and the dielectric layer 140 between the lower electrode LE12 and the upper electrode UE11. The lower electrode LE12 includes a main lower electrode layer 132 and a lower interface electrode layer 134. The main lower electrode layer 132 is spaced apart from the dielectric layer 140 with the lower interface electrode layer 134 therebetween. A top surface of the main lower electrode layer 132 may contact a bottom surface of the lower interface electrode layer 134.

In an example embodiment, the main lower electrode layer 132 may be formed of a metal, a metal nitride, a metal oxide, or a combination of the above metals. For example, the main lower electrode layer 132 may be formed of TiN, MoN, CoN, TaN, TiAlN, TaAlN, W, Ru, $RuO_2$, $SrRuO_3$, Ir, $IrO_2$, Pt, PtO, SRO ($SrRuO_3$), BSRO (($Ba,Sr)RuO_3$), CRO ($CaRuO_3$), LSCO (($La,Sr)CoO_3$), or a combination of the above metals. In an example embodiment, the main lower electrode layer 132 may not include Nb, or, in other example embodiments, the main lower electrode layer 132 may include a NbN layer doped with Ti (in which case the main lower electrode layer 132 may have the same configuration as that of the main lower electrode layer 132 described with reference to FIG. 1).

In the present example embodiment, the lower interface electrode layer 134 is between the main lower electrode layer 132 and the dielectric layer 140. The bottom surface of the lower interface electrode layer 134 may contact the top surface of the main lower electrode layer 132, and the top surface of the main lower electrode layer 132 may contact the bottom surface of the dielectric layer 140.

The lower interface electrode layer 134 may include a Nb oxide layer doped with Ti (hereinafter, referred to as "a NbO layer doped with Ti") or a Nb oxynitride layer doped with Ti (hereinafter, referred to as "a NbON layer doped with Ti"). In an example embodiment, in each of the NbO layer doped with Ti and the NbON layer doped with Ti, the content ratio of the Ti atom to the Nb atom may be 9:1 to 1:99.

A thickness TH21 of the main lower electrode layer 132 may be different from a thickness TH22 of the lower interface electrode layer 134. In an example embodiment, the thickness TH22 of the lower interface electrode layer 134 may be less than the thickness TH21 of the main lower electrode layer 132. For example, the thickness TH21 of the main lower electrode layer 132 may be about 5 nm to about 30 nm and the thickness TH22 of the lower interface electrode layer 134 may be about 3 Å to about 20 Å. If the thickness TH22 of the lower interface electrode layer 134 is too great, the conductivity of the lower interface electrode layer 134 may deteriorate and the lower interface electrode layer 134 may operate as a dielectric having a relatively low dielectric constant and accordingly, the capacitance of the capacitor C12 may deteriorate.

Figure 3:
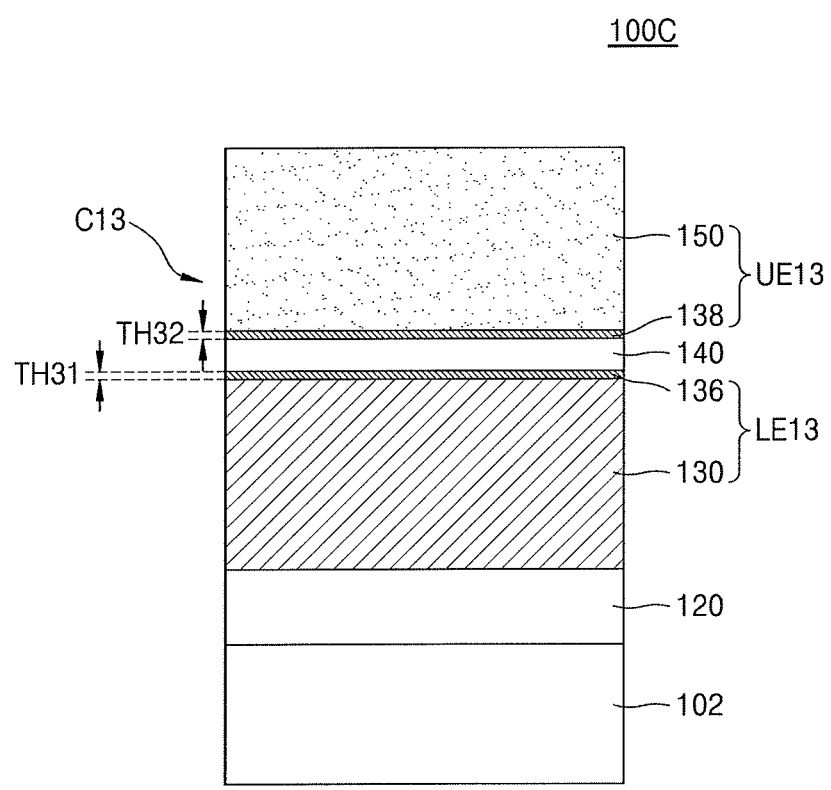
FIG. 3 illustrates a cross-sectional view of a main configuration of an integrated circuit device according to an example embodiment.

FIG. 3 is a cross-sectional view of a main configuration of an integrated circuit device 100C according to an example embodiment. In FIG. 3, the same reference numerals as those of FIGS. 1 and 2 denote the same members and detailed description thereof is omitted.

Referring to FIG. 3, the integrated circuit device 100C includes a capacitor C13. The capacitor C13 has a similar configuration to that of the capacitor C11 illustrated in FIG.

1. The capacitor C13 includes a lower electrode LE13, an upper electrode UE13, and the dielectric layer 140 between the lower electrode LE13 and the upper electrode UE13. The lower electrode LE13 includes the main lower electrode layer 130 and a lower interface electrode layer 136, and the upper electrode UE13 includes the upper electrode layer 150 and an upper interface electrode layer 138. A lower interface electrode layer 136 is between the main lower electrode layer 130 and the dielectric layer 140, and an upper interface electrode layer 138 is between the dielectric layer 140 and the upper electrode layer 150.

A bottom surface of the lower interface electrode layer 136 may contact the top surface of the main lower electrode layer 130, and a top surface of the lower interface electrode layer 136 may contact the bottom surface of the dielectric layer 140. A bottom surface of the upper interface electrode layer 138 may contact a top surface of the dielectric layer 140, and a top surface of the upper interface electrode layer 138 may contact a bottom surface of the upper electrode layer 150. In an example embodiment, in the capacitor C13, the upper interface electrode layer 138 may be omitted. In this case, the top surface of the dielectric layer 140 may contact the bottom surface of the upper electrode layer 150.

The lower interface electrode layer 136 and the upper interface electrode layer 138 may respectively include the NbO layer doped with Ti and the NbON layer doped with Ti. Detailed configurations of the lower interface electrode layer 136 and the upper interface electrode layer 138 are the same as that of the lower interface electrode layer 134 described with reference to FIG. 2. A first thickness TH31 of the lower interface electrode layer 136 and a second thickness TH32 of the upper interface electrode layer 138 may be about 3 Å to about 20 Å. When the first thickness TH31 and the second thickness TH32 are too thick, the conductivity of each of the lower interface electrode layer 136 and the upper interface electrode layer 138 may deteriorate, and the lower interface electrode layer 136 and the upper interface electrode layer 138 may operate as dielectrics having a relatively low dielectric constant and accordingly, the capacitance of the capacitor C13 may deteriorate.

Figure 4:
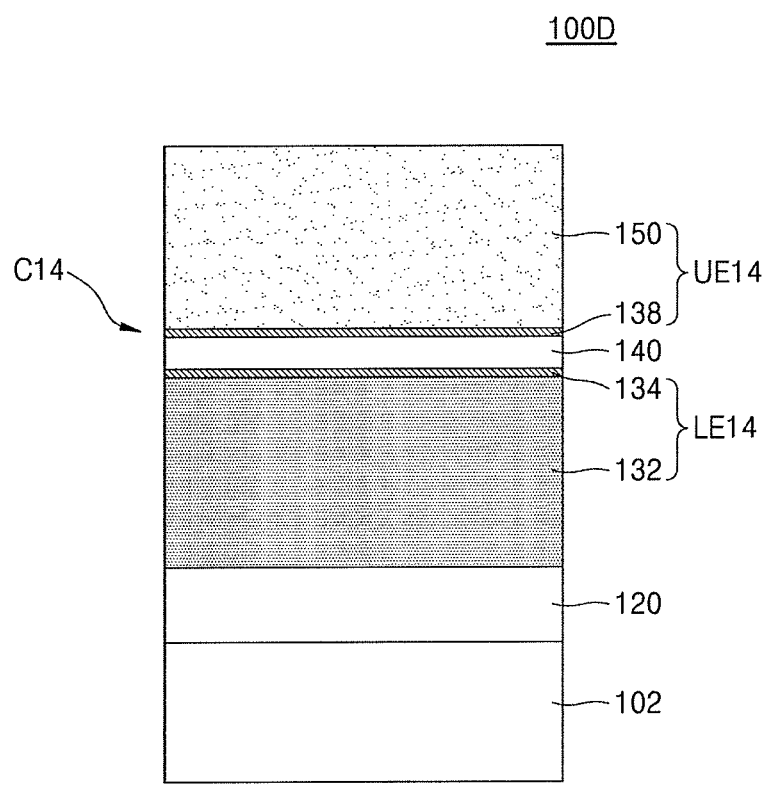
FIG. 4 illustrates a cross-sectional view of a main configuration of an integrated circuit device according to an example embodiment.

FIG. 4 is a cross-sectional view of a main configuration of an integrated circuit device 100D according to an example embodiment. In FIG. 4, the same reference numerals as those of FIGS. 1 to 3 denote the same members and detailed description thereof is omitted.

Referring to FIG. 4, the integrated circuit device 100D includes a capacitor C14. The capacitor C14 has a similar configuration to that of the capacitor C12 of the integrated circuit device 100B illustrated in FIG. 2. The capacitor C14 includes a lower electrode LE14, an upper electrode UE14, and the dielectric layer 140 between the lower electrode LE14 and the upper electrode UE14. The lower electrode LE14 may have the same configuration as that of the lower electrode LE12 described with reference to FIG. 2. The upper electrode UE14 includes the upper electrode layer 150 and the upper interface electrode layer 138. The upper electrode UE14 may have the same configuration as that of the upper electrode UE13 described with reference to FIG. 3. In an example embodiment, in the capacitor C14, the upper interface electrode layer 138 may be omitted. In this case, the top surface of the dielectric layer 140 may contact the bottom surface of the upper electrode layer 150.

Figure 5:
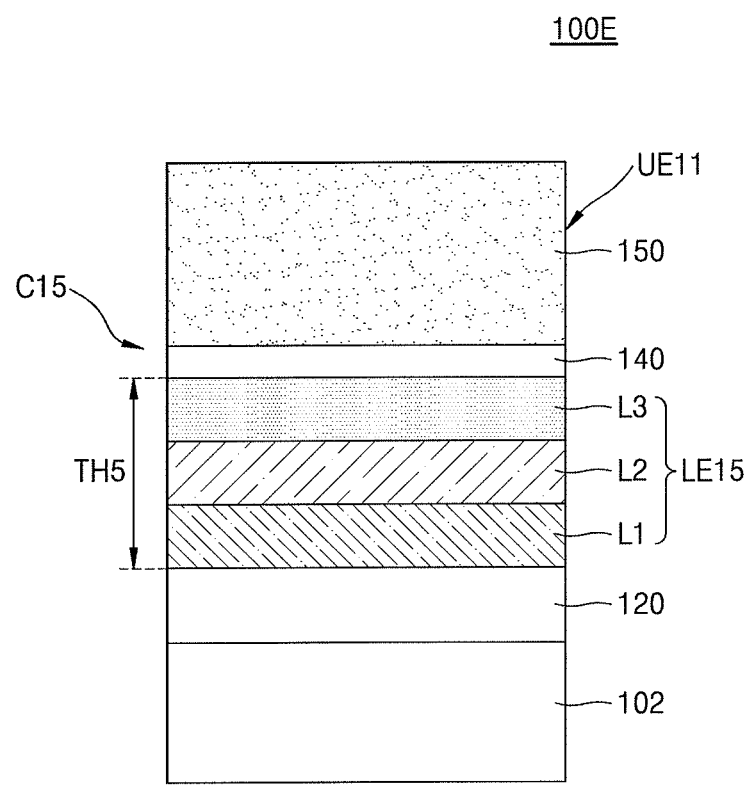
FIG. 5 illustrates a cross-sectional view of a main configuration of an integrated circuit device according to an example embodiment.

FIG. 5 is a cross-sectional view of a main configuration of an integrated circuit device 100E according to an example embodiment. In FIG. 5, the same reference numerals as those of FIG. 1 denote the same members and detailed description thereof is omitted.

Referring to FIG. 5, the integrated circuit device 100E includes a capacitor C15. The capacitor C15 has a similar configuration to that of the capacitor C11 of the integrated circuit device 100A illustrated in FIG. 1. The capacitor C15 includes a lower electrode LE15 including a plurality of layers.

The lower electrode LE15 may include a first lower electrode layer L1, a second lower electrode layer L2, and a third lower electrode layer L3 that are sequentially stacked on the substrate 102. At least one of the first to third lower electrode layers L1, L2, and L3 may include a Nb containing layer doped with Ti. When each of the first to third lower electrode layers L1, L2, and L3 includes a Nb containing layer doped with Ti, in each of the first to third lower electrode layers L1, L2, and L3, the content ratio of the Nb atom to the Ti atom may vary. In the lower electrode LE15, the content ratio of the Nb atom to the Ti atom may gradually increase toward the dielectric layer 140. For example, the content ratio of the Nb atom to the Ti atom may be greatest in the third lower electrode layer L3 closest to the dielectric layer 140 among the first lower electrode layer L1, the second lower electrode layer L2, and the third lower electrode layer L3.

In an example embodiment, each of the first to third lower electrode layers L1, L2, and L3 includes a NbN layer doped with Ti and, in each of the first to third lower electrode layers L1, L2, and L3, the content ratio of the Ti atom to the Nb atom may be in the range of about 9:1 to about 1:99. In the first to third lower electrode layers L1, L2, and L3, the content ratio of the Nb atom gradually increases toward the dielectric layer 140 and may be greatest in the third lower electrode layer L3 closest to the dielectric layer 140.

In other example embodiments, in the first to third lower electrode layers L1, L2, and L3, the first lower electrode layer L1 farthest from the dielectric layer 140 does not include Nb and each of the second and third lower electrode layers L2 and L3 may include a NbN layer doped with Ti. In this case, the content ratio of the Ti atom to the Nb atom in the second and third lower electrode layers L2 and L3 may be in the range of about 9:1 to about 1:99. In each of the second and third lower electrode layers L2 and L3, the content ratio of the Nb atom to the Ti atom may vary. For example, the first lower electrode layer L1 includes a TiN layer, each of the second and third lower electrode layers L2 and L3 includes the NbN layer doped with Ti, and the content ratio of the Nb atom to the Ti atom in the third lower electrode layer L3 may be greater than the content ratio of the Nb atom to the Ti atom in the second lower electrode layer L2.

At least one of the first to third lower electrode layers L1, L2, and L3 may include an additional dopant formed of at least one of Co, Sn, V, Ta, Db, P, As, Sb, and Bi. In the first to third lower electrode layers L1, L2, and L3, an atomic ratio of the additional dopant to the Nb atom may be about 0.01 to about 0.15.

The lower electrode LE15 may have a thickness TH5 of about 5 nm to about 30 nm. A thickness of each of the first to third lower electrode layers L1, L2, and L3 may be varied. The thickness of each of the first to third lower electrode layers L1, L2, and L3 may be varied and at least parts of the first to third lower electrode layers L1, L2, and L3 may have the same thickness.

In FIG. 5, a case in which the lower electrode LE15 includes three main lower electrode layers including the first to third lower electrode layers L1, L2, and L3 is illustrated. In various example embodiments, the lower electrode LE15 may have a multilayer structure including two or four or more main lower electrode layers having different content ratios of the Nb atom. The content ratio of the Nb atom of each of the plurality of main lower electrode layers may gradually increase toward the dielectric layer 140.

In an example embodiment, the lower electrode LE15 may further include a lower interface electrode layer between the third lower electrode layer L3 and the dielectric layer 140. For example, the lower interface electrode layer may have the same configuration as that of the lower interface electrode layer 136 described with reference to FIG. 3.

Figure 6:
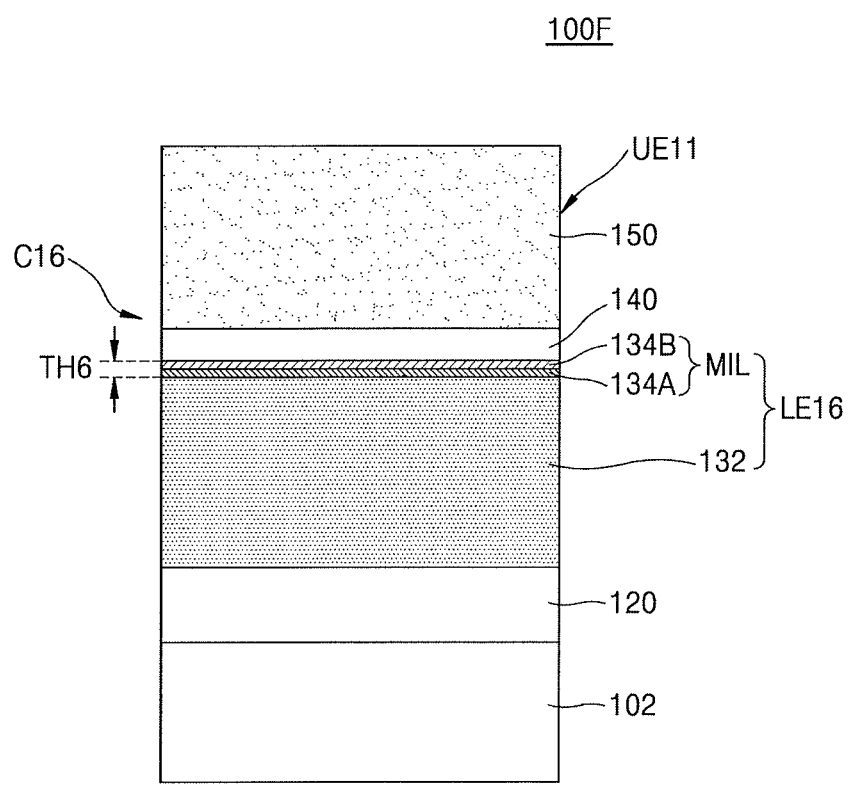
FIG. 6 illustrates a cross-sectional view of a main configuration of an integrated circuit device according to an example embodiment.

FIG. 6 is a cross-sectional view of a main configuration of an integrated circuit device 100F according to an example embodiment. In FIG. 6, the same reference numerals as those of FIG. 1 denote the same members and detailed description thereof is omitted.

Referring to FIG. 6, the integrated circuit device 100F includes a capacitor C16. The capacitor C16 has a similar configuration to that of the capacitor C12 of the integrated circuit device 100B illustrated in FIG. 2. The capacitor C16 includes a lower electrode LE16, the upper electrode UE11, and the dielectric layer 140 between the lower electrode LE16 and the upper electrode UE11. The lower electrode LE16 includes the main lower electrode layer 132 and a multiple interface electrode layer MIL. The multiple interface electrode layer MIL may be between the main lower electrode layer 132 and the dielectric layer 140.

The multiple interface electrode layer MIL may include a first lower interface electrode layer 134A and a second lower interface electrode layer 134B that are sequentially stacked on the main lower electrode layer 132. A bottom surface of the first lower interface electrode layer 134A may contact the top surface of the main lower electrode layer 132, and a top surface of the second lower interface electrode layer 134B may contact the bottom surface of the dielectric layer 140.

Each of the first and second lower interface electrode layers 134A and 134B may include a NbO layer doped with Ti or a NbON layer doped with Ti. In each of the first and second lower interface electrode layers 134A and 134B, the content ratio of the Nb atom to the Ti atom may vary. In each of the first and second lower interface electrode layers 134A and 134B, the content ratio of the Ti atom to the Nb atom may be in the range of about 9:1 to about 1:99. For example, the content ratio of the Nb atom to the Ti atom in the second lower interface electrode layer 134B may be greater than the content ratio of the Nb atom to the Ti atom in the first lower interface electrode layer 134A.

At least one of the first and second lower interface electrode layers 134A and 134B may include an additional dopant formed of at least one of Co, Sn, V, Ta, Db, P, As, Sb, and Bi. In each of the first and second lower interface electrode layers 134A and 134B, an atomic ratio of the additional dopant to the Nb atom may be about 0.01 to about 0.15.

A total thickness TH6 of the first and second lower interface electrode layers 134A and 134B may be about 3 Å to about 20 Å. Each of the first and second lower interface electrode layers 134A and 134B may have the same configuration as that of the lower interface electrode layer 134 described with reference to FIG. 2.

In FIG. 6, a case in which the multiple interface electrode layer MIL includes the first and second lower interface electrode layers 134A and 134B is illustrated. In example embodiments, the multiple interface electrode layer MIL may include three or more lower interface electrode layers having different content ratios of the Nb atom. The content ratio of the Nb atom in each of the plurality of lower interface electrode layers that configure the multiple interface electrode layer MIL may gradually increase toward the dielectric layer 140.

Figure 7:
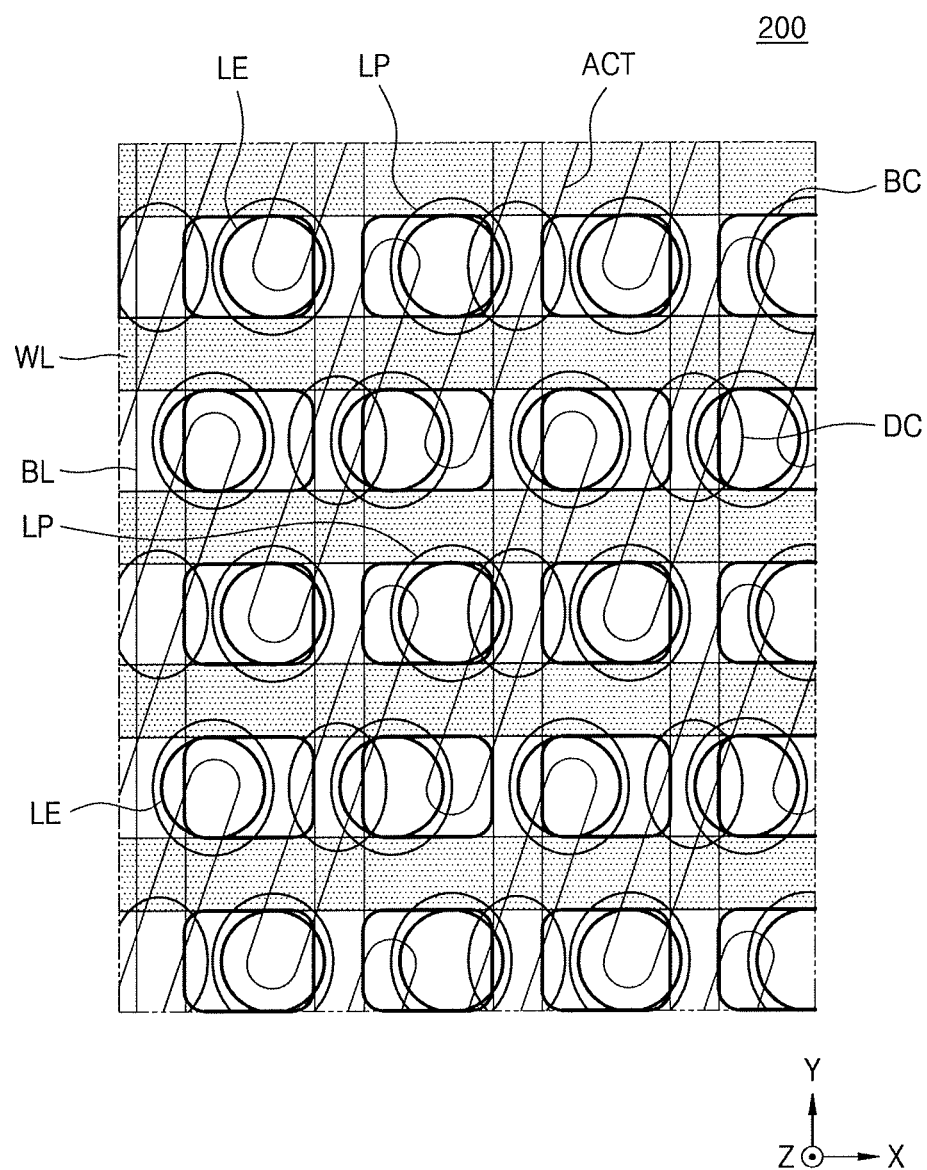
FIG. 7 illustrates a schematic plan layout of an integrated circuit device according to an example embodiment.

FIG. 7 is a schematic plan layout illustrating an integrated circuit device 200 according to an example embodiment. In FIG. 7, plan layouts of partial configurations of a memory cell array region of the integrated circuit device 200 are illustrated.

Referring to FIG. 7, the integrated circuit device 200 may include a plurality of active regions ACT arranged to extend in a diagonal direction with respect to an X direction and a Y direction on a plane. A plurality of word lines WL may extend in parallel extending in the X direction to cross the plurality of active regions ACT. On the plurality of word lines WL, a plurality of bit lines BL may extend in parallel in the Y direction that intersects with the X direction. The plurality of bit lines BL may be connected to the active regions ACT through direct contacts DC.

A plurality of buried contacts BC may be formed between two adjacent bit lines BL in the plurality of bit lines BL. On the plurality of buried contacts BC, a plurality of conductive landing pads LP may be formed. The plurality of conductive landing pads LP may be arranged so that at least parts thereof overlap the plurality of buried contacts BC. On the plurality of conductive landing pads LP, lower electrodes LE may be formed. The lower electrodes LE may be connected to the plurality of active regions ACT through the plurality of buried contacts BC and the plurality of conductive landing pads LP.

Figure 8A:
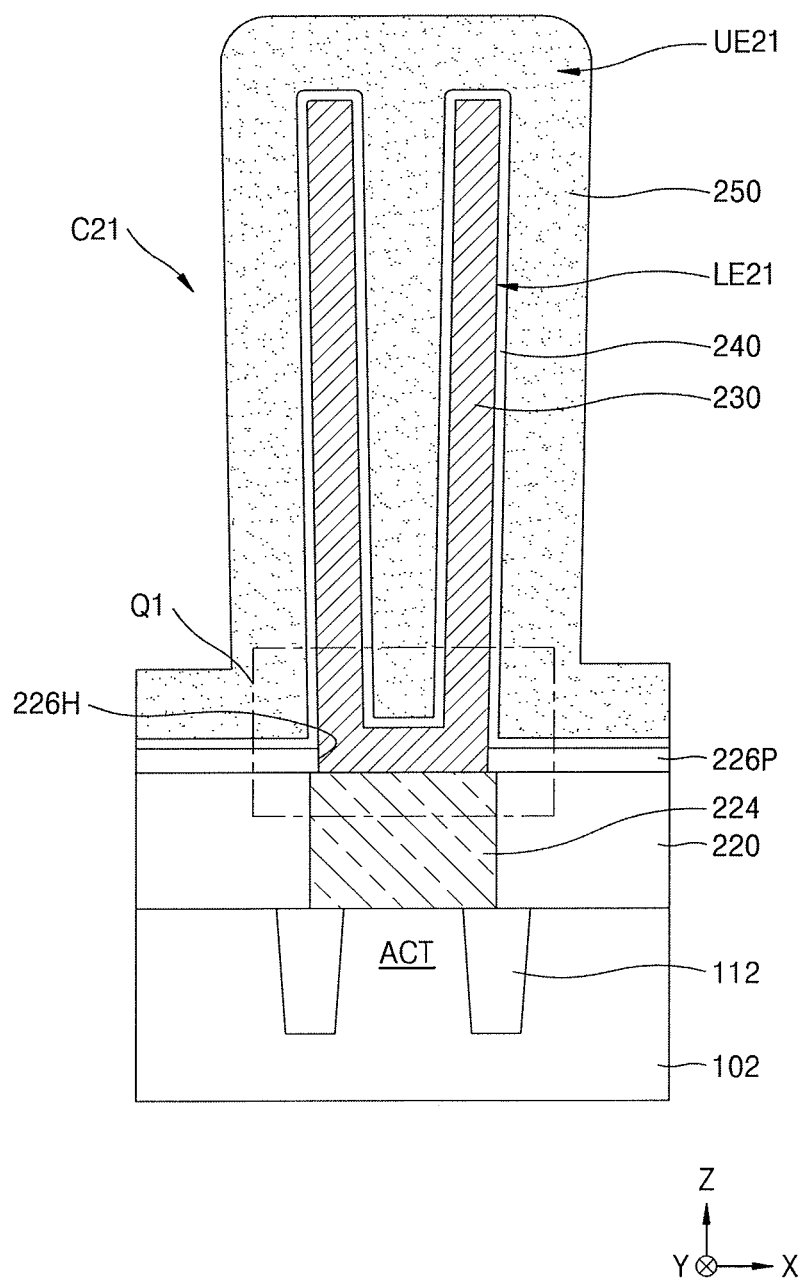
FIG. 8A illustrates a cross-sectional view of an integrated circuit device according to an example embodiment and FIG. 8B is a cross-sectional view of an enlargement of local region Q1 of FIG. 8A.
Figure 8B:
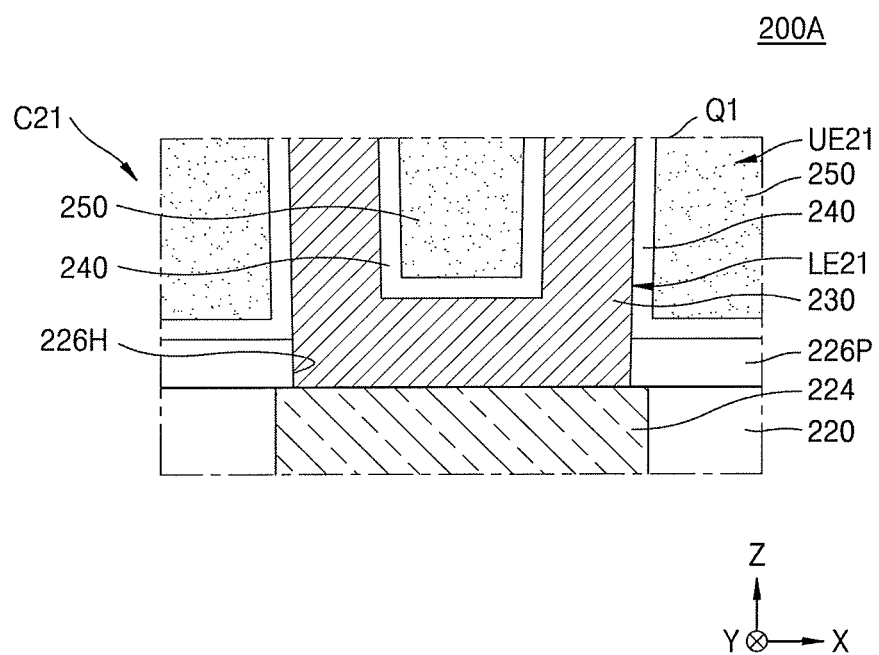

FIG. 8A is a cross-sectional view of an integrated circuit device 200A according to an example embodiment, and FIG. 8B is a cross-sectional view of an enlargement of local region Q1 of FIG. 8A. In FIGS. 8A and 8B, the same reference numerals as those of FIG. 1 denote the same members and detailed description thereof is omitted.

Referring to FIGS. 8A and 8B, the integrated circuit device 200A may configure a part of the integrated circuit device 200 illustrated in FIG. 7. In FIGS. 8A and 8B, partial elements of the integrated circuit device 200A are omitted or simplified. However, it is to be understood that a configuration of the integrated circuit device 200A is not limited to that illustrated in FIGS. 8A and 8B and includes characteristic configurations described as follows.

The integrated circuit device 200A includes the substrate 102 including the plurality of active regions ACT and a lower structure 220 formed on the substrate 102. In the substrate 102, the plurality of active regions ACT may be defined by a plurality of isolation layers 112. A conductive region 224 may be connected to the plurality of active regions ACT through the lower structure 220.

Each of the plurality of isolation layers 112 may include an oxide layer, a nitride layer, or a combination of the above layers. The lower structure 220 may include an insulating layer including a silicon oxide layer, a silicon nitride layer, or a combination of the above layers. In other example embodiments, the lower structure 220 may include various conductive regions, for example, a wiring line layer, a contact plug, a transistor, and an insulating layer for insulating the wiring line layer, the contact plug, and the transistor from each other. The conductive region 224 may be formed of polysilicon, metal, conductive metal nitride, metal silicide, or a combination of polysilicon, metal, conductive metal nitride, and metal silicide. The lower structure 220 may include the plurality of bit lines BL described with reference to FIG. 7. The conductive region 224 may include the buried contacts BC and the conductive landing pads LP that are described with reference to FIG. 7.

On the lower structure 220 and the conductive region 224, an insulating pattern 226P having a plurality of openings 226H may be arranged. The insulating pattern 226P may be formed of silicon nitride, silicon oxynitride, or a combination of silicon nitride and silicon oxynitride.

On the conductive region 224, a capacitor C21 may be arranged. The capacitor C21 includes a lower electrode LE21, an upper electrode UE21, and a dielectric layer 240 between the lower electrode LE21 and the upper electrode UE21. The lower electrode LE21 may include a main lower electrode layer 230. The main lower electrode layer 230 may extend longitudinally in a vertical direction (a Z direction) away from the substrate 102 from a top surface of the conductive region 224 through an opening 226H of the insulating pattern 226P and may be cylindrical or cup-shaped to limit an internal space in which a bottom that faces the substrate 102 is blocked. The dielectric layer 240 may conformally cover an external surface of the main lower electrode layer 230 and an internal surface in an internal space of the main lower electrode layer 230. The upper electrode UE21 may include an upper electrode layer 250. The upper electrode layer 250 may include a portion that fills the internal space of the main lower electrode layer 230 on the dielectric layer 240 and a portion that faces an external surface of the lower electrode LE21 with the dielectric layer 240 therebetween.

Detailed configurations of the main lower electrode layer 230, the dielectric layer 240, and the upper electrode layer 250 are the same as those of the main lower electrode layer 130, the dielectric layer 140, and the upper electrode layer 150 that are described with reference to FIG. 1.

Figure 9A:
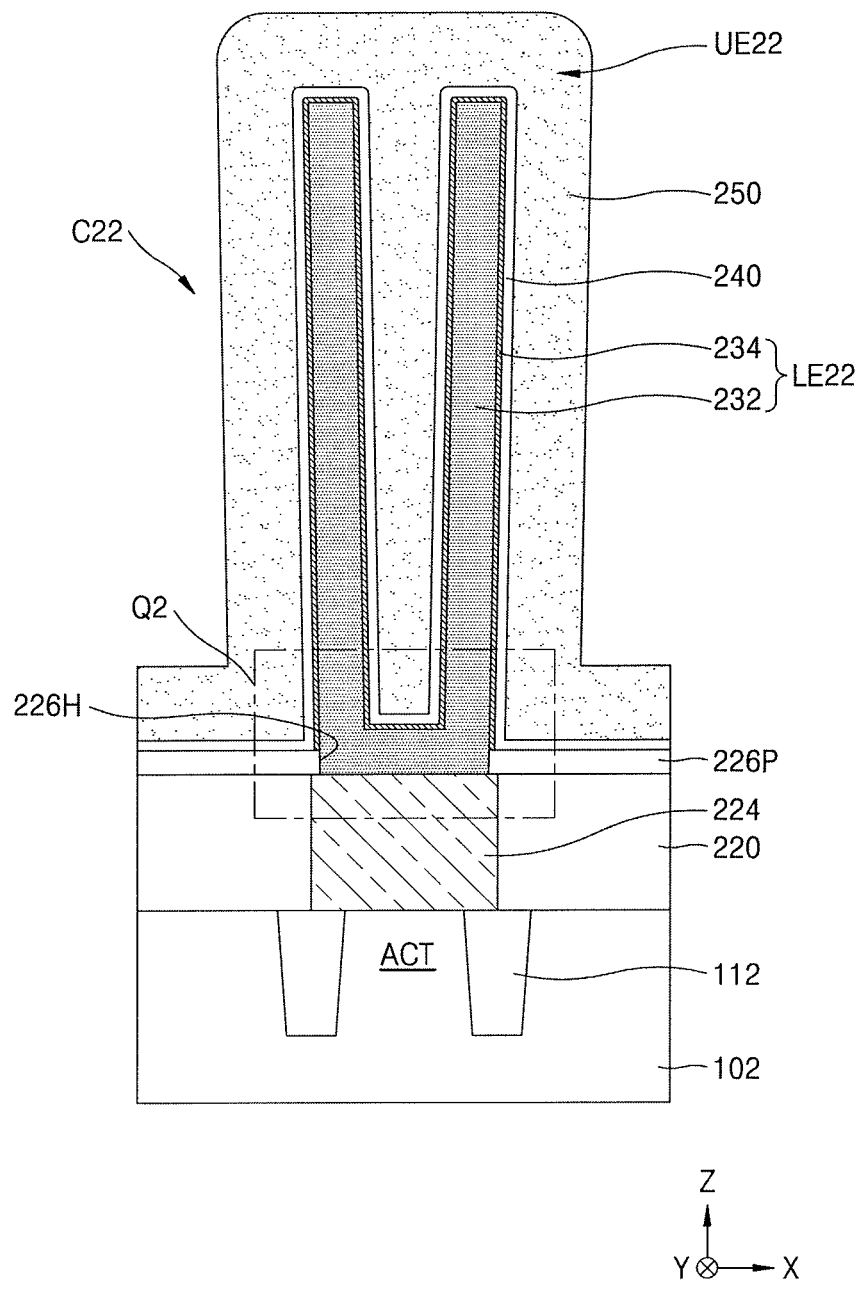
FIG. 9A illustrates a cross-sectional view of an integrated circuit device according to an example embodiment and FIG. 9B is a cross-sectional view of an enlargement of local region Q2 of FIG. 9A.
Figure 9B:
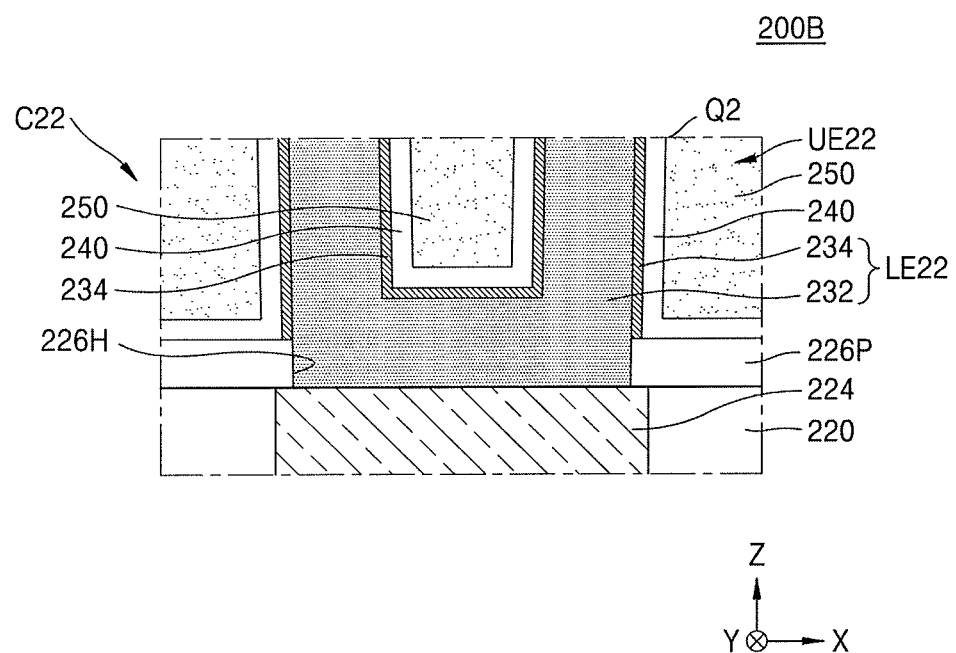

FIG. 9A is a cross-sectional view of an integrated circuit device 200B according to an example embodiment, and FIG. 9B is a cross-sectional view of an enlargement of local region Q2 of FIG. 9A. In FIGS. 9A and 9B, the same reference numerals as those of FIGS. 1, 8A, and 8B denote the same members and detailed description thereof is omitted.

Referring to FIGS. 9A and 9B, the integrated circuit device 200B may configure a part of the integrated circuit device 200 illustrated in FIG. 7. In FIGS. 9A and 9B, partial elements of the integrated circuit device 200 are omitted or simplified. However, it is to be understood that a configuration of the integrated circuit device 200B is not limited to that illustrated in FIGS. 9A and 9B and includes characteristic configurations described as follows.

The integrated circuit device 200B has a similar configuration to that of the integrated circuit device 200A described with reference to FIGS. 8A and 8B. The integrated circuit device 200B includes a capacitor C22 arranged on the conductive region 224. The capacitor C22 includes a lower electrode LE22, an upper electrode UE22, and the dielectric layer 240 between the lower electrode LE22 and the upper electrode UE22.

The lower electrode LE22 includes a main lower electrode layer 232 and a lower interface electrode layer 234. The main lower electrode layer 232 may be cylinder or cup-shaped like the main lower electrode layer 230 illustrated in FIGS. 8A and 8B. The lower interface electrode layer 234 may conformally cover an external surface of the main lower electrode layer 232 and an internal surface in an internal space of the main lower electrode layer 232. The dielectric layer 240 may conformally cover an external surface of the lower electrode LE22 and an internal surface in an internal space of the lower electrode LE22. The dielectric layer 240 may be spaced apart from the main lower electrode layer 232 with the lower interface electrode layer 234 therebetween. The upper electrode UE22 may include the upper electrode layer 250.

Detailed configurations of the main lower electrode layer 232 and the lower interface electrode layer 234 are the same as those of the main lower electrode layer 132 and the lower interface electrode layer 134 that are described with reference to FIG. 2.

Figure 10:
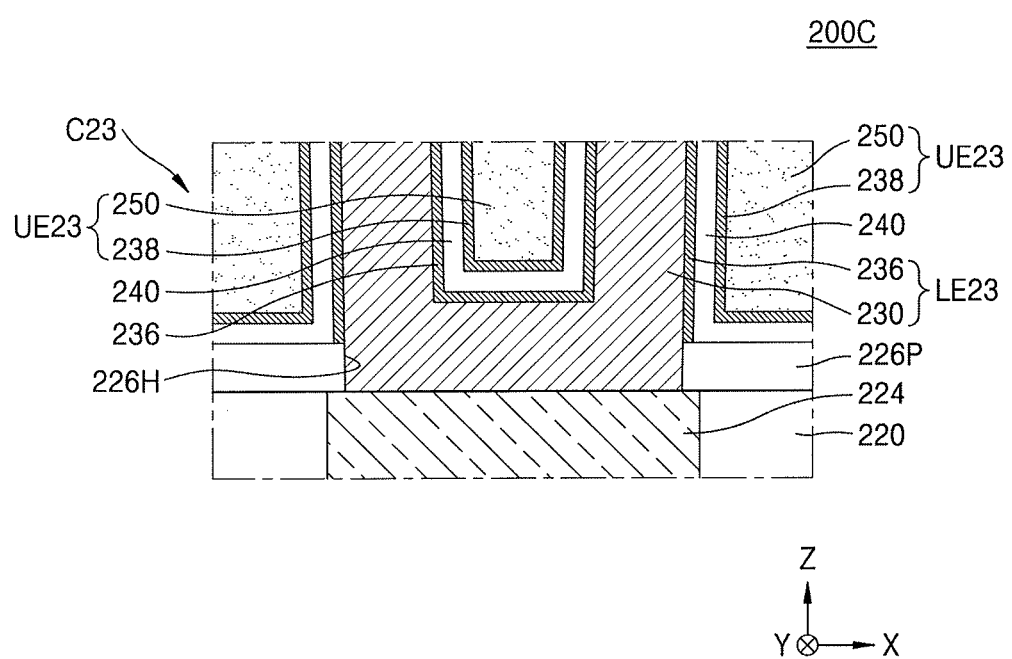
FIG. 10 illustrates a cross-sectional view of an integrated circuit device according to an example embodiment.

FIG. 10 is a cross-sectional view of a portion of an integrated circuit device 200C according to an example embodiment. In FIG. 10, a portion corresponding to a local region Q1 of FIG. 8A is illustrated. In FIG. 10, the same reference numerals as those of FIGS. 8A and 8B denote the same members and detailed description thereof is omitted.

Referring to FIG. 10, the integrated circuit device 200C has a similar configuration to that of the integrated circuit device 200A described with reference to FIGS. 8A and 8B. The integrated circuit device 200C includes a capacitor C23 arranged on the conductive region 224. The capacitor C23 includes a lower electrode LE23, an upper electrode UE23, and the dielectric layer 240 between the lower electrode LE23 and the upper electrode UE23.

The lower electrode LE23 includes the main lower electrode layer 230 and a lower interface electrode layer 236. The upper electrode UE23 includes the upper electrode layer 250 and an upper interface electrode layer 238. The lower interface electrode layer 236 is between the main lower electrode layer 230 and the dielectric layer 240. The upper interface electrode layer 238 is between the dielectric layer 240 and the upper electrode layer 250.

The lower interface electrode layer 236 may conformally cover the external surface of the main lower electrode layer 230 and the internal surface in the internal space of the main lower electrode layer 230. The dielectric layer 240 may conformally cover an external surface of the lower electrode LE23 and an internal surface in an internal space of the lower electrode LE23. The dielectric layer 240 may be spaced apart from the main lower electrode layer 230 with the lower interface electrode layer 236 therebetween. The upper interface electrode layer 238 may conformally cover the external surface of the lower electrode LE23 and the internal surface in the internal space of the lower electrode LE23 on the dielectric layer 240. In an example embodiment, in the capacitor C23, the upper interface electrode layer 238 may be omitted. In this case, the dielectric layer 240 may contact the upper electrode layer 250.

Detailed configurations of the lower interface electrode layer 236 and the upper interface electrode layer 238 are the same as those of the lower interface electrode layer 136 and the upper interface electrode layer 138 that are described with reference to FIG. 3.

Figure 11:
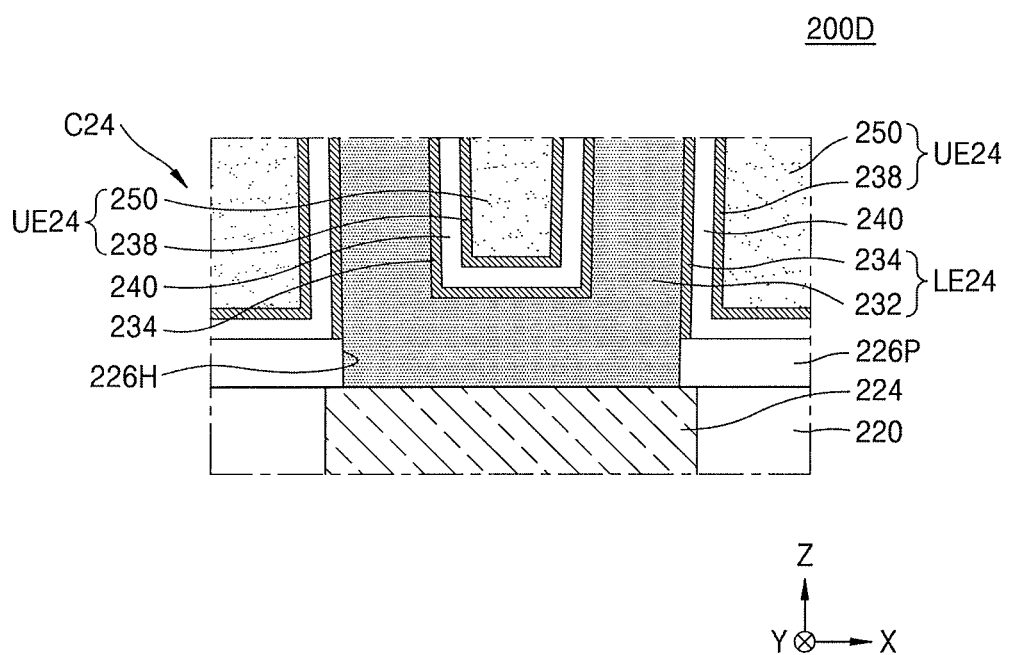
FIG. 11 illustrates a cross-sectional view of an integrated circuit device according to an example embodiment.

FIG. 11 is a cross-sectional view of a portion of an integrated circuit device 200D according to an example embodiment. In FIG. 11, a portion corresponding to a local region Q2 of FIG. 9A is illustrated. In FIG. 11, the same reference numerals as those of FIGS. 9A and 9B denote the same members and detailed description thereof is omitted.

Referring to FIG. 11, the integrated circuit device 200D has a similar configuration to that of the integrated circuit device 200B described with reference to FIGS. 9A and 9B. The integrated circuit device 200D includes a capacitor C24 arranged on the conductive region 224. The capacitor C24 includes a lower electrode LE24, an upper electrode UE24, and the dielectric layer 240 between the lower electrode LE24 and the upper electrode UE24.

The lower electrode LE24 may have the same configuration as that of the lower electrode LE22 illustrated in FIGS. 9A and 9B. The upper electrode UE24 includes the upper electrode layer 250 and the upper interface electrode layer 238. The upper interface electrode layer 238 may be between the dielectric layer 240 and the upper electrode layer 250. The upper interface electrode layer 238 may conformally cover the external surface of the lower electrode LE24 and the internal surface in the internal space of the lower electrode LE24 on the dielectric layer 240. In an example embodiment, in the capacitor C24, the upper interface electrode layer 238 may be omitted. In this case, the dielectric layer 240 may contact the upper electrode layer 250. A detailed configuration of the upper interface electrode layer 238 is the same as that of the upper interface electrode layer 138 described with reference to FIG. 3.

Figure 12:
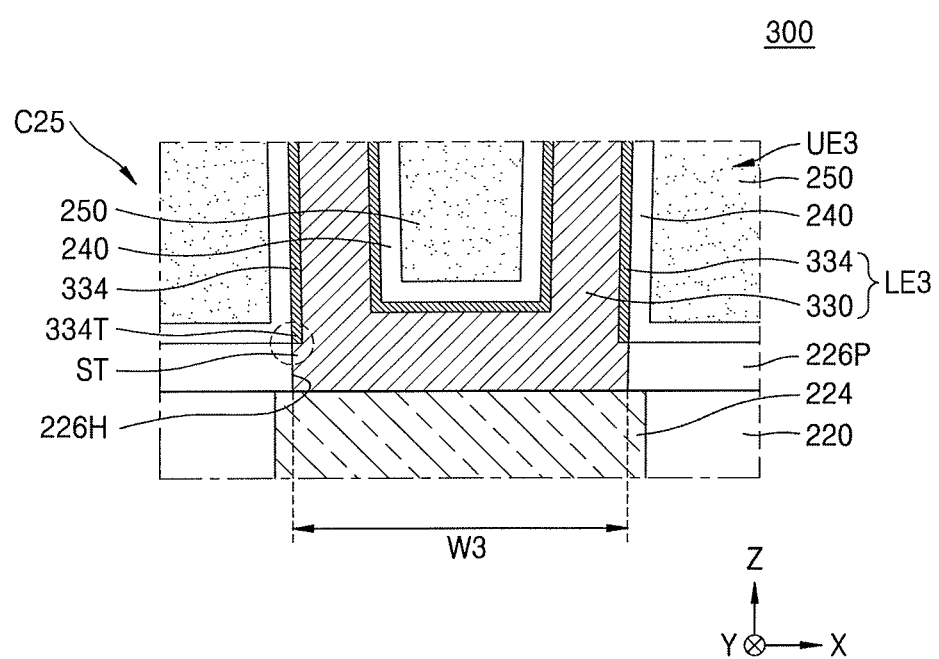
FIG. 12 illustrates a cross-sectional view of an integrated circuit device according to an example embodiment.

FIG. 12 is a cross-sectional view of a portion of an integrated circuit device 300 according to an example embodiment. In FIG. 12, a portion corresponding to a local region Q1 of FIG. 8A is illustrated. In FIG. 12, the same reference numerals as those of FIGS. 8A and 8B denote the same members and detailed description thereof is omitted.

Referring to FIG. 12, the integrated circuit device 300 has a similar configuration to that of the integrated circuit device 200A described with reference to FIGS. 8A and 8B. The integrated circuit device 300 includes a capacitor C25 arranged on the conductive region 224. The capacitor C25 includes a lower electrode LE3, an upper electrode UE3, and the dielectric layer 240 between the lower electrode LE3 and the upper electrode UE3.

The lower electrode LE3 includes a main lower electrode layer 330 and a lower interface electrode layer 334. The upper electrode UE3 includes the upper electrode layer 250. The main lower electrode layer 330 may have the same configuration as that of the main lower electrode layer 230 described with reference to FIGS. 8A and 8B. In the main lower electrode layer 330, a step difference ST may be formed on an external wall adjacent to an opening 226H of an insulating pattern 226P. In the main lower electrode layer 330, a portion that fills the opening 226H of the insulating pattern 226P may have a first width W3 in a horizontal direction (for example, in the X direction). A horizontal direction width of the main lower electrode layer 330 may be less than the first width W3 passing through the step difference ST away from the substrate 102. That is, in the main lower electrode layer 330, the first width W3 in the horizontal direction of a portion at a lower level than that of the step difference ST may be greater than a width of a partial region at a higher level than that of the step difference ST.

The lower interface electrode layer 334 may be between the main lower electrode layer 330 and a dielectric layer 240. A lowermost surface level of the lower interface electrode layer 334 may be higher than that of the main lower electrode layer 330. The term "level" in the current specification means a distance from the substrate 102 in a vertical direction (a Z direction or a −Z direction). An external lowermost portion 334T of the lower interface electrode layer 334 may contact the step difference ST of the main lower electrode layer 330. The external lowermost portion 334T of the lower interface electrode layer 334 may be closer to the horizontal direction center of the main lower electrode layer 330 than an internal wall of the opening 226H of the insulating pattern 226P. The lower interface electrode layer 334 may include the NbO layer doped with Ti or the NbON layer doped with Ti. A detailed configuration of the lower interface electrode layer 334 is the same as that of the lower interface electrode layer 134 described with reference to FIG. 2 or the lower interface electrode layer 136 described with reference to FIG. 3.

The dielectric layer 240 may conformally cover an external surface of the lower electrode LE3 and an internal surface in an internal space of the lower electrode LE3 on the lower interface electrode layer 334. The upper electrode UE3 may include the upper electrode layer 250.

Figure 13:
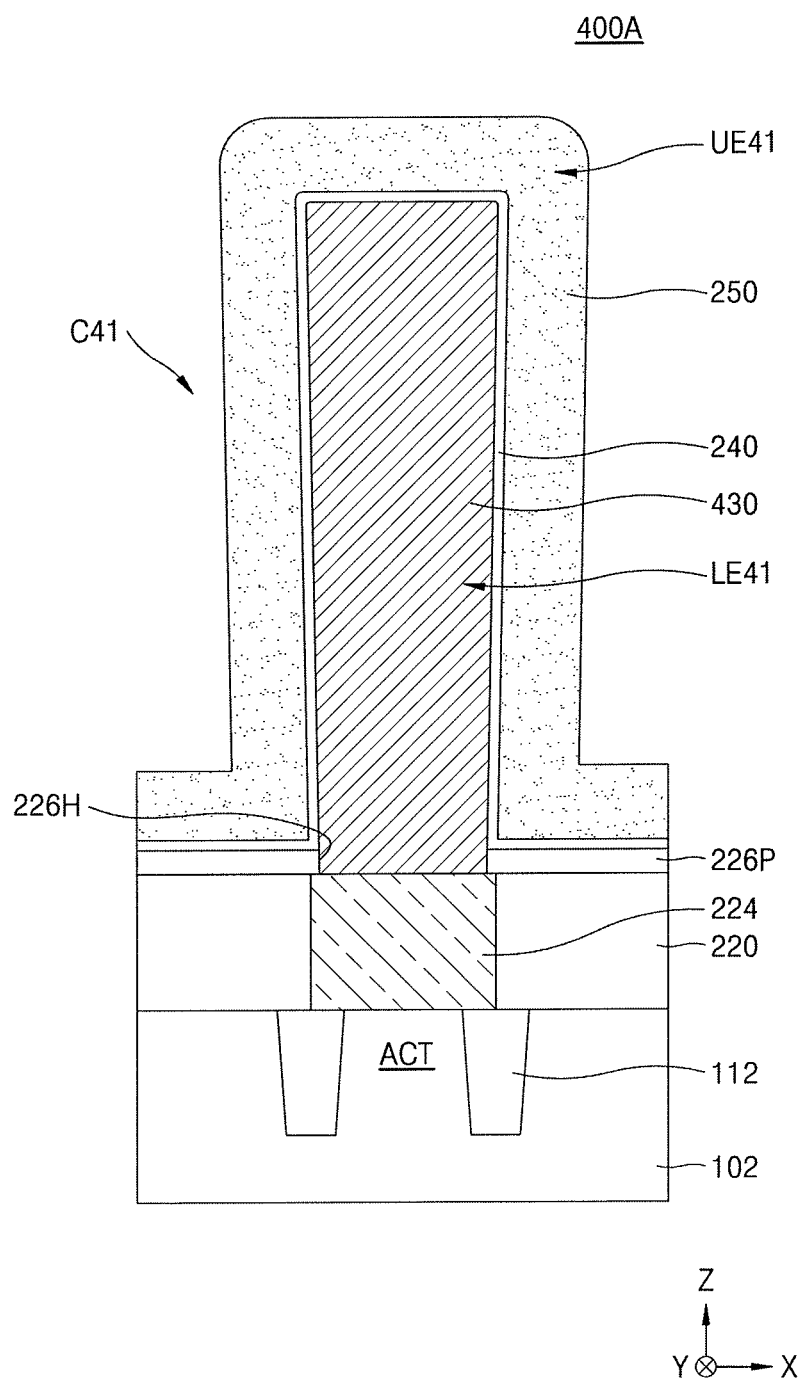
FIG. 13 illustrates a cross-sectional view of an integrated circuit device according to an example embodiment.

FIG. 13 is a cross-sectional view of an integrated circuit device 400A according to an example embodiment. Referring to FIG. 13, the same reference numerals as those of FIGS. 8A and 8B denote the same members and detailed description thereof is omitted.

Referring to FIG. 13, the integrated circuit device 400A has a similar configuration to that of the integrated circuit device 200A described with reference to FIGS. 8A and 8B. The integrated circuit device 400A includes a capacitor C41 arranged on the conductive region 224. The capacitor C41 includes a lower electrode LE41, an upper electrode UE41, and the dielectric layer 240 between the lower electrode LE41 and the upper electrode UE41.

The lower electrode LE41 may include a main lower electrode layer 430. The main lower electrode layer 430 may be pillar-shaped to longitudinally extend in the vertical direction (the Z direction) away from the substrate 102 from the top surface of the conductive region 224 through the opening 226H of the insulating pattern 226P. The dielectric layer 240 may conformally cover an external surface of the main lower electrode layer 430. The upper electrode UE41 may include the upper electrode layer 250. A detailed configuration of the main lower electrode layer 430 is the same as that of the main lower electrode layer 130 described with reference to FIG. 1.

Figure 14:
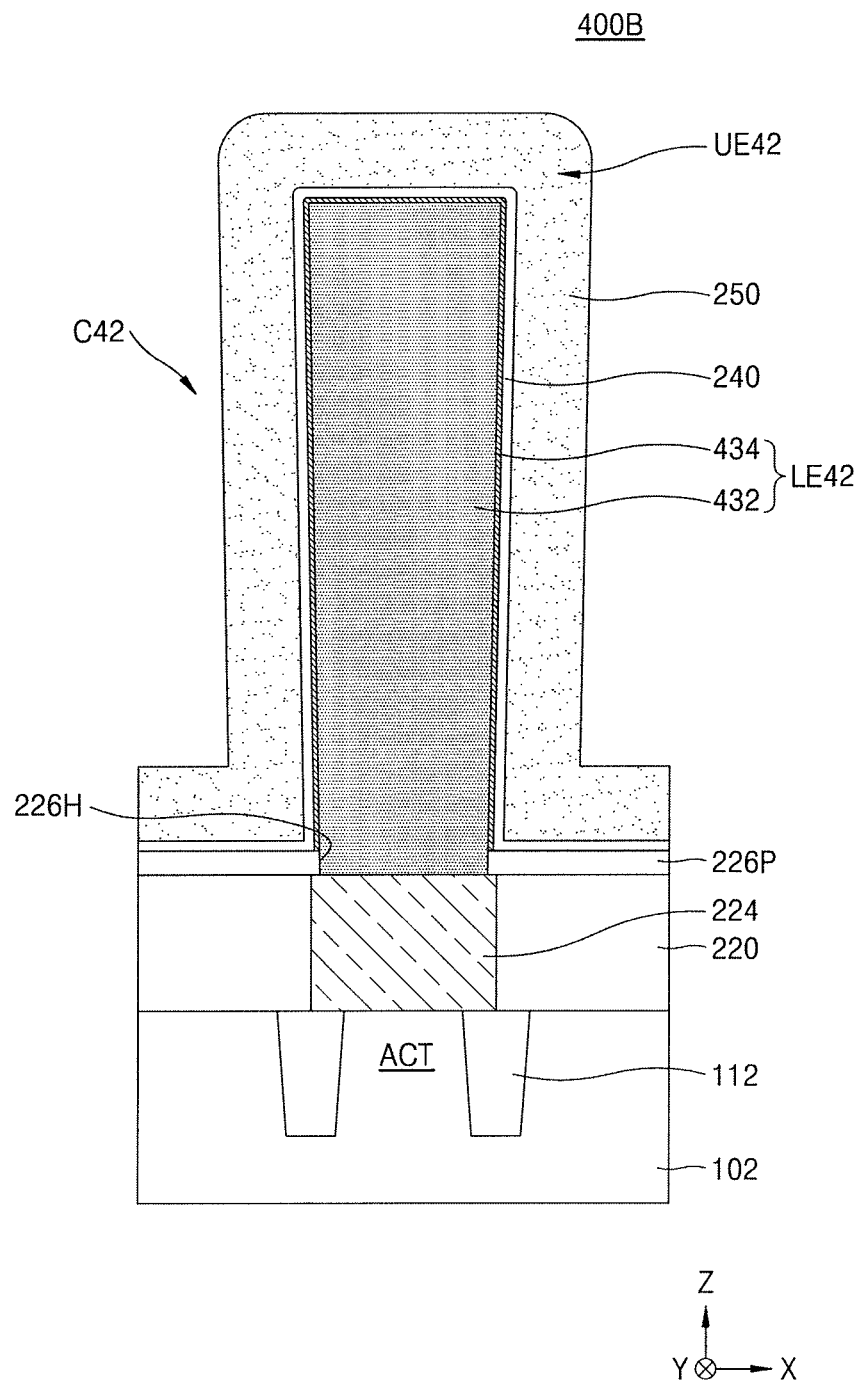
FIG. 14 illustrates a cross-sectional view of an integrated circuit device according to an example embodiment.

FIG. 14 is a cross-sectional view of an integrated circuit device 400B according to an example embodiment. In FIG. 14, the same reference numerals as those of FIGS. 9A and 9B denote the same members and detailed description thereof is omitted.

Referring to FIG. 14, the integrated circuit device 400B has a similar configuration to that of the integrated circuit device 200B described with reference to FIGS. 9A and 9B. The integrated circuit device 400B includes a capacitor C42 arranged on the conductive region 224. The capacitor C42 includes a lower electrode LE42, an upper electrode UE42, and the dielectric layer 240 between the lower electrode LE42 and the upper electrode UE42.

The lower electrode LE42 includes a main lower electrode layer 432 and a lower interface electrode layer 434. The main lower electrode layer 432 may be pillar-shaped to longitudinally extend in the vertical direction (the Z direction) away from the substrate 102 from the top surface of the conductive region 224 through the opening 226H of the insulating pattern 226P. Detailed configurations of the main lower electrode layer 432 and the lower interface electrode layer 434 are the same as those of the main lower electrode layer 132 and the lower interface electrode layer 134 that are described with reference to FIG. 2.

The dielectric layer 240 may conformally cover an external surface of the main lower electrode layer 432. The upper electrode UE42 may include the upper electrode layer 250.

Each of the integrated circuit devices described with reference to FIGS. 1 to 14 includes the Nb containing layer doped with Ti in a portion adjacent to at least the dielectric layer in the lower electrode of the capacitor. Therefore, it may be possible to prevent a depletion layer from being generated due to undesired oxidation of the lower electrode in an interface between the lower electrode and the dielectric layer and accordingly, a difference between a minimum capacitance Cmin value and a maximum capacitance Cmax value may be minimized and capacitance may be increased.

Figure 15:
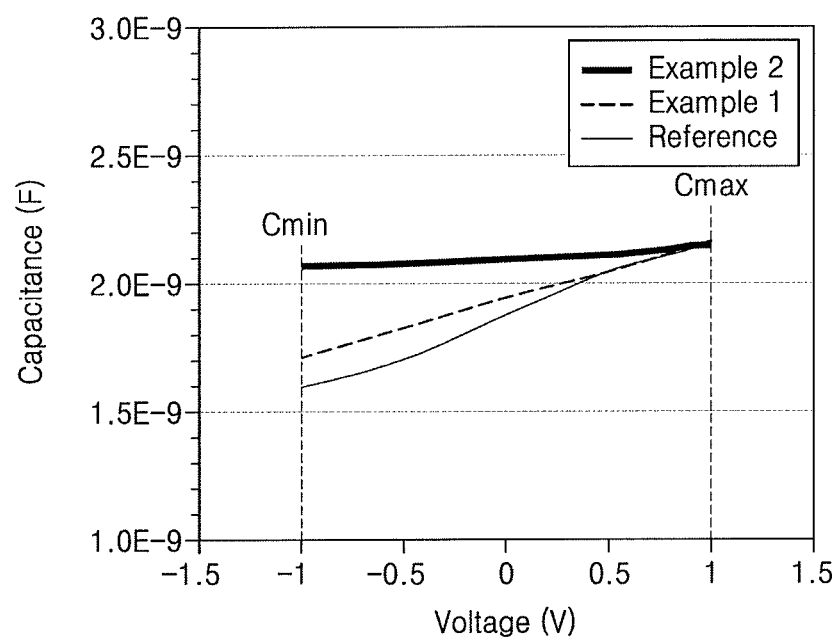
FIG. 15 illustrates a graph of a result obtained by evaluating the capacitance of a capacitor of an integrated circuit device according to an example embodiment together with a comparative example.

FIG. 15 is a graph of a result obtained by evaluating the capacitance of a capacitor of an integrated circuit device according to an example embodiment together with a comparative example.

For the evaluation of FIG. 15, Example 1, Example 2, and a Reference were prepared. In Example 1 (a capacitor having the structure illustrated in FIG. 1), the main lower electrode layer 130 included the NbN layer doped with Ti, the dielectric layer 140 included a multilayer structured dielectric layer in which a $ZrO_2$ layer and an $Al_2O_3$ layer were stacked, and the upper electrode layer 150 included the TiN layer. In Example 2 (a capacitor having the structure illustrated in FIG. 2), the main lower electrode layer 132 included the TiN layer, the lower interface electrode layer 134 included the NbO layer doped with Ti, and each of the dielectric layer 140 and the upper electrode layer 150 had the same structure as that of Example 1. The Reference was the same as Example 1 except for having a capacitor in which a lower electrode was a TiN single layer.

In the evaluation result of FIG. 15, in the capacitors of Example 1 and Example 2, the Cmin value is increased in comparison with the capacitor of the Reference. As noted from the result of FIG. 15, in the capacitors of Example 1 and Example 2, the portion adjacent to at least the dielectric layer in the lower electrode includes the Nb containing layer doped with Ti and accordingly, the depletion layer was hardly generated in the interface between the lower electrode and the dielectric layer and, as a result, the Cmin value was increased. Therefore, in the capacitors of Example 1 and Example 2, the capacitance improved in comparison with that of the capacitor of the Reference.

A method of manufacturing an integrated circuit device according to an example embodiment will now be described in detail.

FIGS. 16A to 16I are cross-sectional views illustrating processes of a method of manufacturing an integrated circuit device, according to an example embodiment. An example manufacturing method of the integrated circuit device 200A illustrated in FIGS. 8A and 8B will be described with reference to FIGS. 16A to 16I.

Figure 16A:
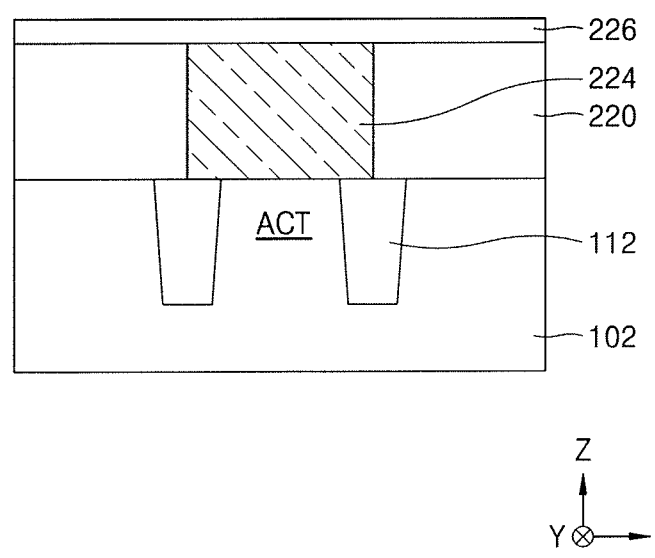
FIGS. 16A to 16I illustrate cross-sectional views of processes of a method of manufacturing an integrated circuit device, according to an example embodiment.

Referring to FIG. 16A, the lower structure 220 and the conductive region 224 connected to the active regions ACT through the lower structure 220 are formed on a substrate 102 in which the active regions ACT are defined by the isolation layers 112. Then, an insulating layer 226 that covers the lower structure 220 and the conductive region 224 is formed.

The insulating layer 226 may be formed of an insulating material having etching selectivity with respect to the lower structure 220. The insulating layer 226 may be formed of silicon nitride, silicon oxynitride, or a combination of silicon nitride and silicon oxynitride.

Figure 16B:
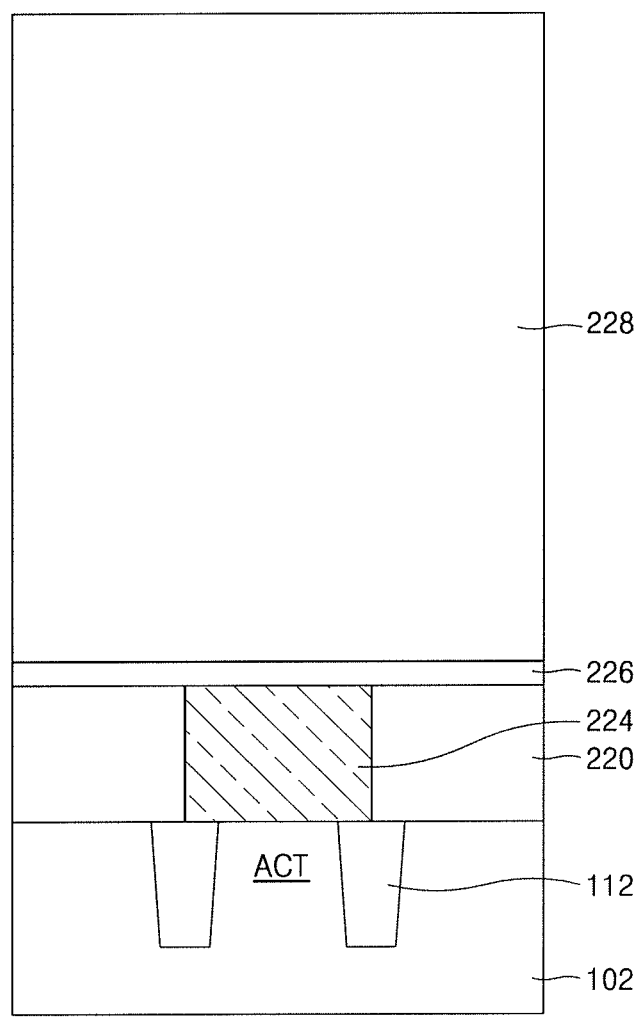

Referring to FIG. 16B, a mold layer 228 is formed on the insulating layer 226.

The mold layer 228 may be formed of an insulating material having etching selectivity with respect to the insulating layer 226. In some embodiments, the mold layer 228 may include an oxide layer, for example, a boro phospho silicate glass (BPSG) layer.

Figure 16C:
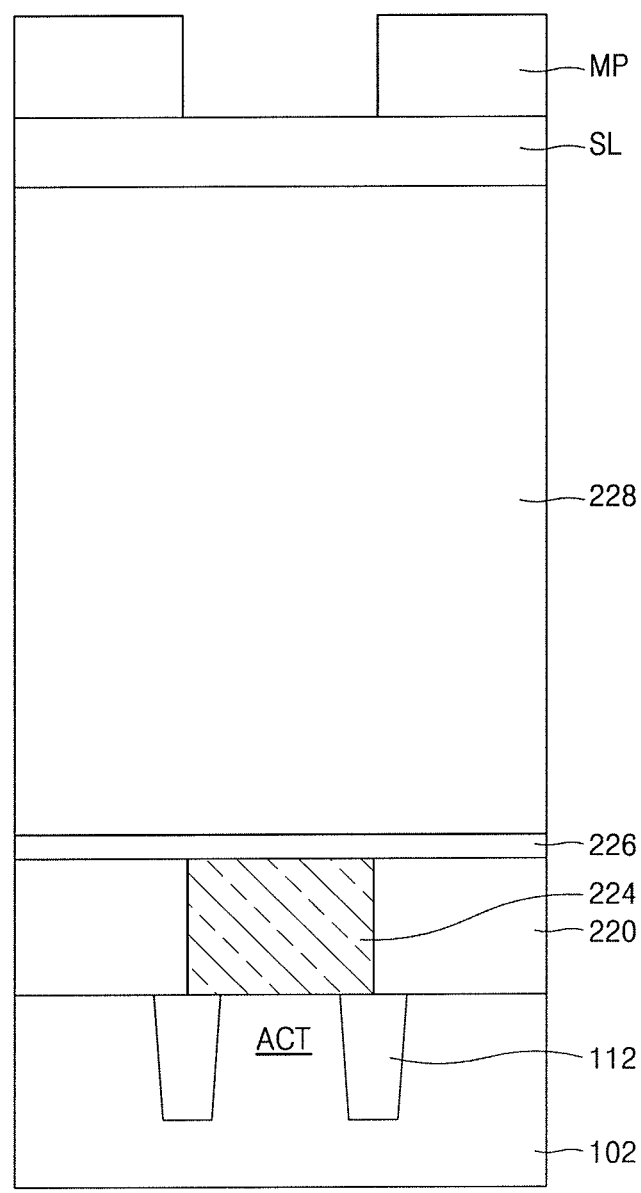

Referring to FIG. 16C, a sacrificial layer SL and a mask pattern MP are sequentially formed on the mold layer 228.

The sacrificial layer SL may include an oxide layer. The mask pattern MP may include a nitride layer, an oxide layer, a polysilicon layer, a photoresist layer, or a combination of the above layers.

Figure 16D:
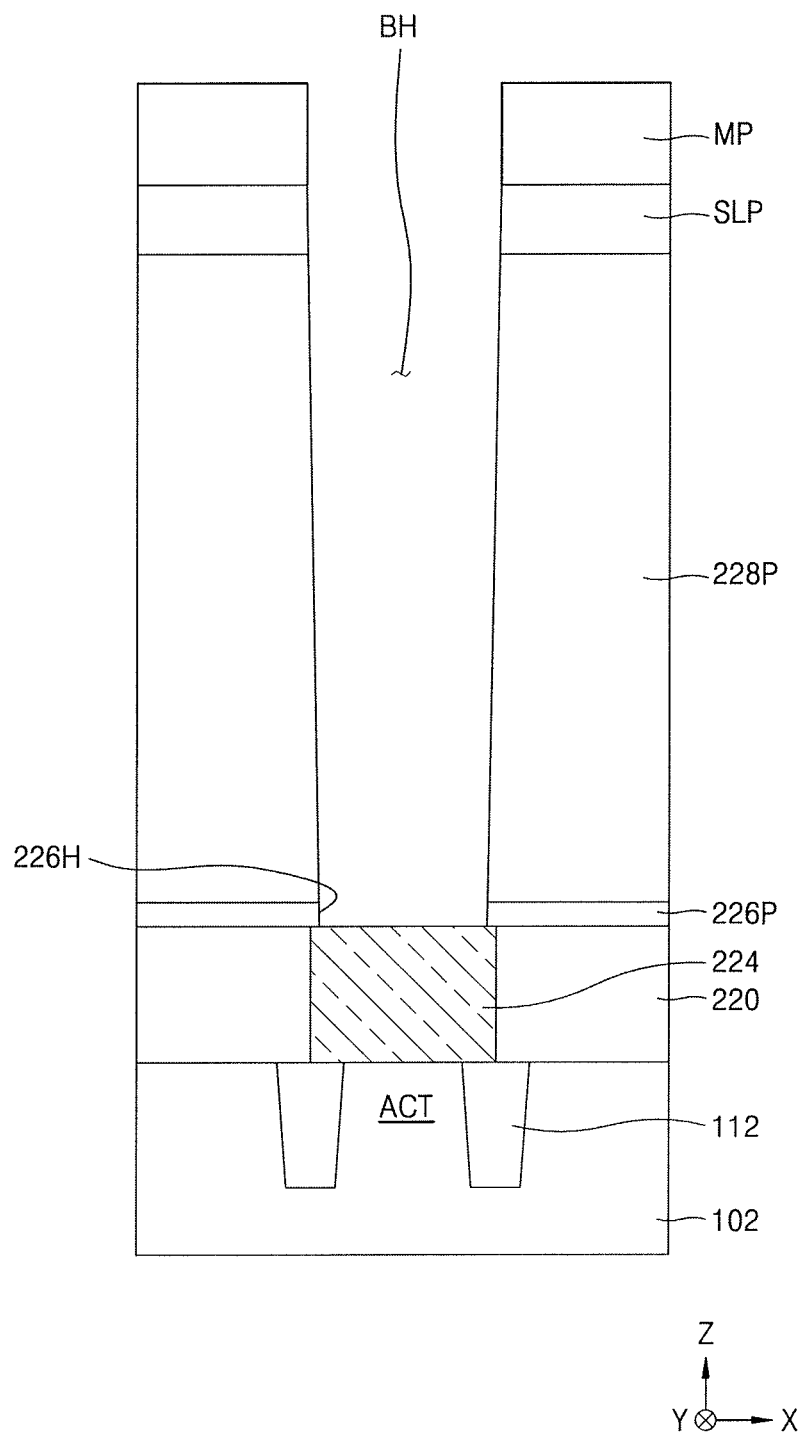

Referring to FIG. 16D, in the resultant structure of FIG. 16C, the sacrificial layer SL, the mold layer 228, and the insulating layer 226 are anisotropically etched by using the mask pattern MP as an etching mask and using the insulating layer 226 as an etching stop layer and accordingly, a sacrificial pattern SLP, a mold pattern 228P, and an insulating pattern 226P that limit a hole BH are formed. The opening 226H that exposes the conductive region 224 may be formed in the insulating pattern 226P.

Figure 16E:
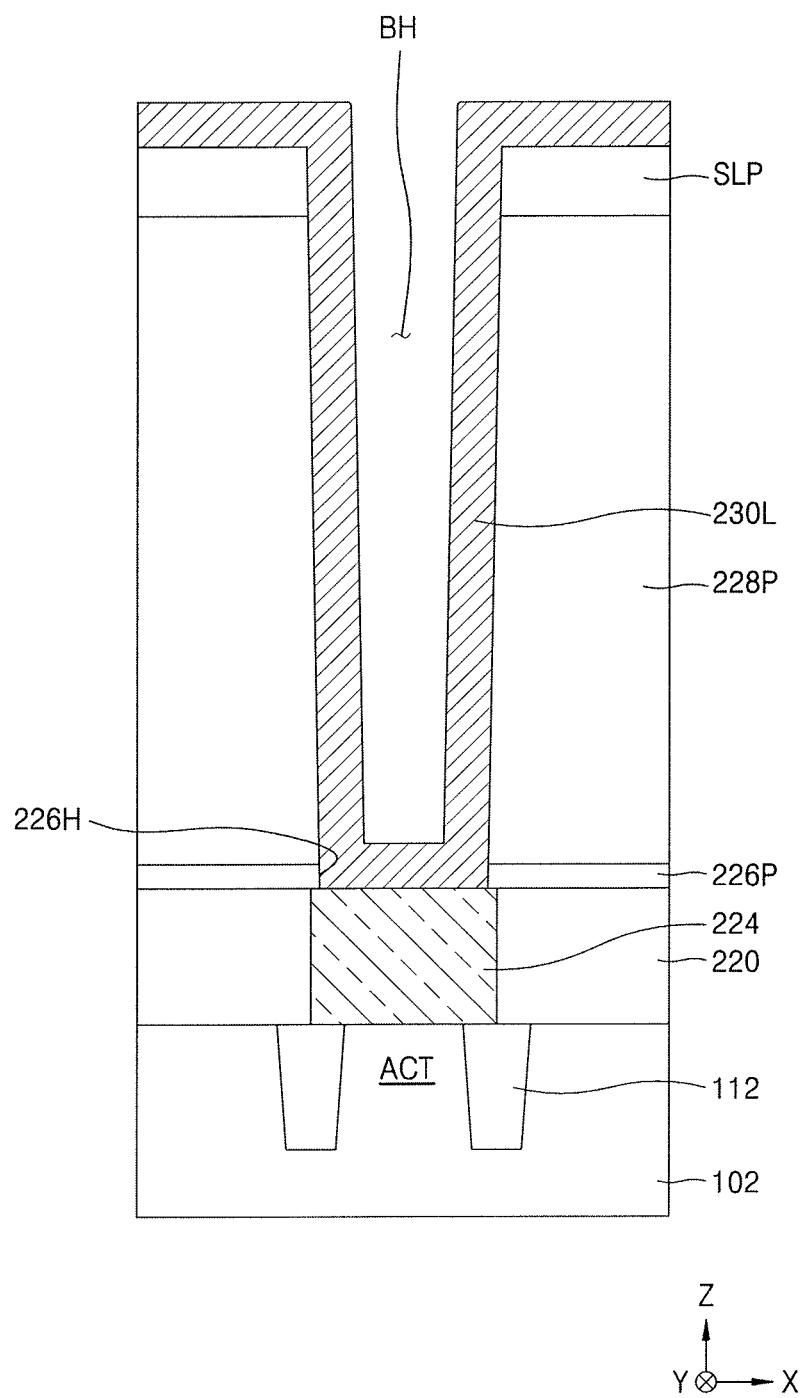

Referring to FIG. 16E, after removing the mask pattern MP from the resultant structure of FIG. 16D, a preliminary lower electrode layer 230L that covers a surface of the conductive region 224, a surface of the insulating pattern 226P, a surface of the mold pattern 228P, and a surface of the sacrificial pattern SLP inside and outside the hole BH is formed. The preliminary lower electrode layer 230L may conformally cover the top surface of the conductive region 224 and side walls of the mold pattern 228P that are exposed through the hole BH. After the preliminary lower electrode layer 230L is formed, a part of the hole BH may be left empty.

A material of the preliminary lower electrode layer 230L is the same as a material of the main lower electrode layer 130 described with reference to FIG. 1. In order to form the preliminary lower electrode layer 230L, an atomic layer deposition (ALD) process may be used.

When the preliminary lower electrode layer 230L includes the NbN layer doped with Ti, in an example ALD process of forming the preliminary lower electrode layer 230L, after loading the substrate 102 in a reaction chamber, until the preliminary lower electrode layer 230L is obtained, an ALD unit cycle including processes of supplying reaction materials to the surfaces of the conductive region 224, the mold pattern 228P, and the sacrificial pattern SLP, which are exposed through the hole BH on the substrate 102, may be performed a plurality of times. The ALD unit cycle may include a first process of forming a Nb chemical absorbing layer by supplying a Nb precursor to the exposed surfaces, a second process of purging the unnecessary Nb precursor left on the substrate 102 and discharging the purged Nb precursor to the outside of the reaction chamber, a third process of forming a Ti dopant chemical absorbing layer on portions in which the Nb chemical absorbing layer is not formed among the exposed surfaces on the substrate 102 by supplying a Ti dopant precursor to the resultant structure in which the Nb chemical absorbing layer is formed, a fourth process of purging the unnecessary Ti dopant precursor and discharging the purged Ti dopant precursor to the outside of the reaction chamber, a fifth process of forming a NbN atomic layer doped with Ti by supplying a reaction gas including nitrogen atoms to the resultant structure in which the Nb chemical absorbing layer and the Ti dopant chemical absorbing layer are formed, and a sixth process of purging unnecessary portions in the reaction gas including the nitrogen atoms and discharging the purged portions to the outside of the reaction chamber.

In an example embodiment, the Nb precursor may be formed of a compound of a chemical formula $Nb(NRR')_5$, a compound of a chemical formula $(NRR')_3Nb=NR''$, or a combination of the above compounds. In the above chemical formulas, each of R, R', and R" is H, a C1 to C10 alkyl group, alkenyl group, cycloalkyl group, cycloalkenyl group, or aryl group. Other Nb precursors may also be used.

In an example embodiment, the Ti dopant precursor may be formed of titanium tetrakis-isopropoxide: Ti(O-iProp)$_4$, titanium halide, cyclopentadienyl titanium, titanium bis(isopropoxide)bis(2,2,6,6-tetramethyl-3,5-heptanedionate) (Ti(O-iProp)$_2$(thd)$_2$), titanium bis(4-(2-methylethoxy)imino-2-pentanoate) (Ti(2meip)$_2$), titanium bis[4-(ethoxy)imino-2-pentanoate] (Ti(eip)$_2$), titanium bis[2,2-dimethyl-5-(2-methylethoxy)imino-3-heptanoate](Ti(22dm2meih)$_2$), or a combination of the above compounds.

For performing the purge, an inactive gas such as Ar, He, or Ne or a N$_2$ gas may be used. The reaction gas including the nitrogen atoms may be formed of NH$_3$, N$_2$H$_4$, a hydrazine derivative, or a combination thereof. The hydrazine derivative may be C1 to C10 alkyl hydrazine, C1 to C10 dialkyl hydrazine, or a combination thereof.

When the preliminary lower electrode layer 230L includes the NbN layer including a plurality of kinds of dopants including Ti, in an example ALD process of forming the preliminary lower electrode layer 230L, the above-described ALD unit cycle may be performed a plurality of times. After the fourth process is performed in the above-described ALD unit cycle, before the fifth process is performed, a seventh process of supplying at least one of a Co precursor, an Sn precursor, a V precursor, a Ta precursor, a Db precursor, a P precursor, an As precursor, an Sb precursor, and a Bi precursor, and an eighth process of purging unnecessary portions in the precursor supplied in the seventh process and discharging the purged portions to the outside of the reaction chamber may be performed.

Figure 16F:
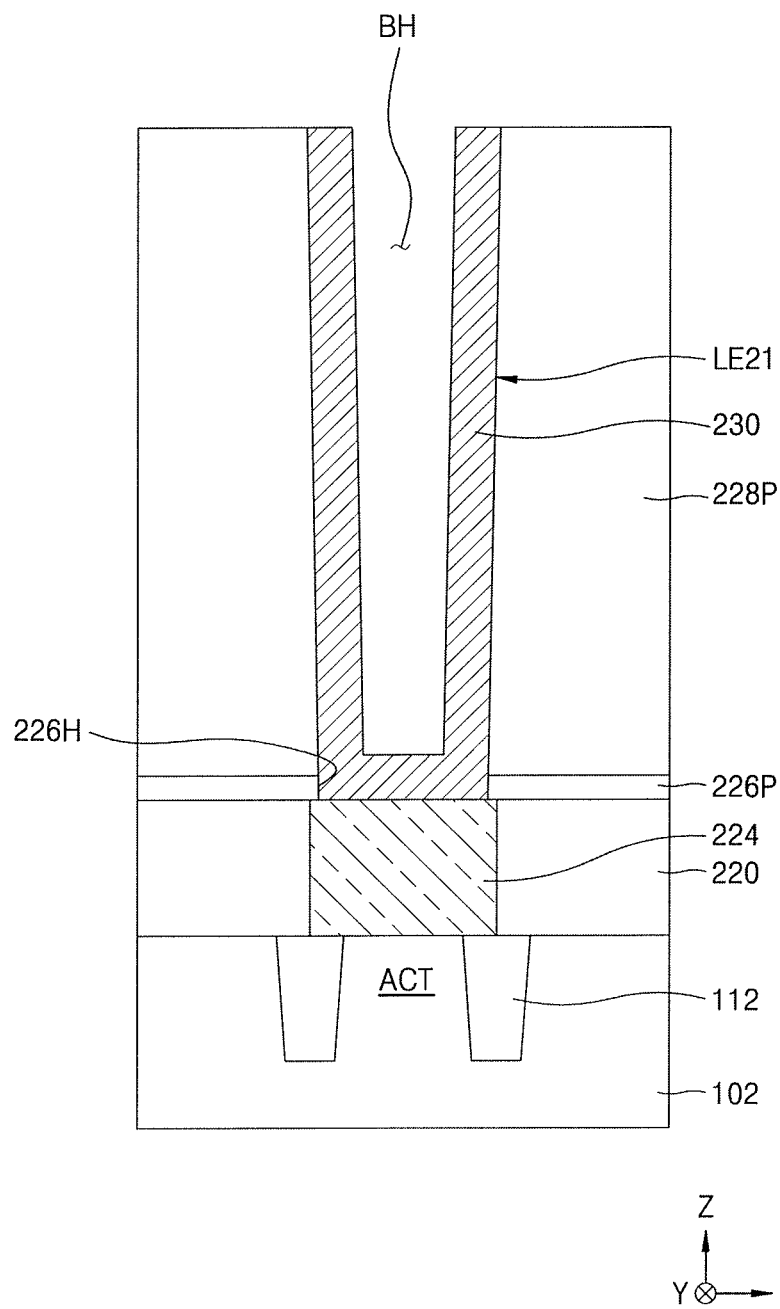

Referring to FIG. 16F, the main lower electrode layer 230 is formed from the preliminary lower electrode layer 230L by partially removing a top portion of the preliminary lower electrode layer 230L from the resultant structure of FIG. 16E. The main lower electrode layer 230 may configure the lower electrode LE21.

In order to form the main lower electrode layer 230, until a top surface of the mold pattern 228P is exposed, a part of the preliminary lower electrode layer 230L and the sacrificial pattern SLP (refer to FIG. 16E) may be removed by using an etch back or chemical mechanical polishing (CMP) process.

Figure 16G:
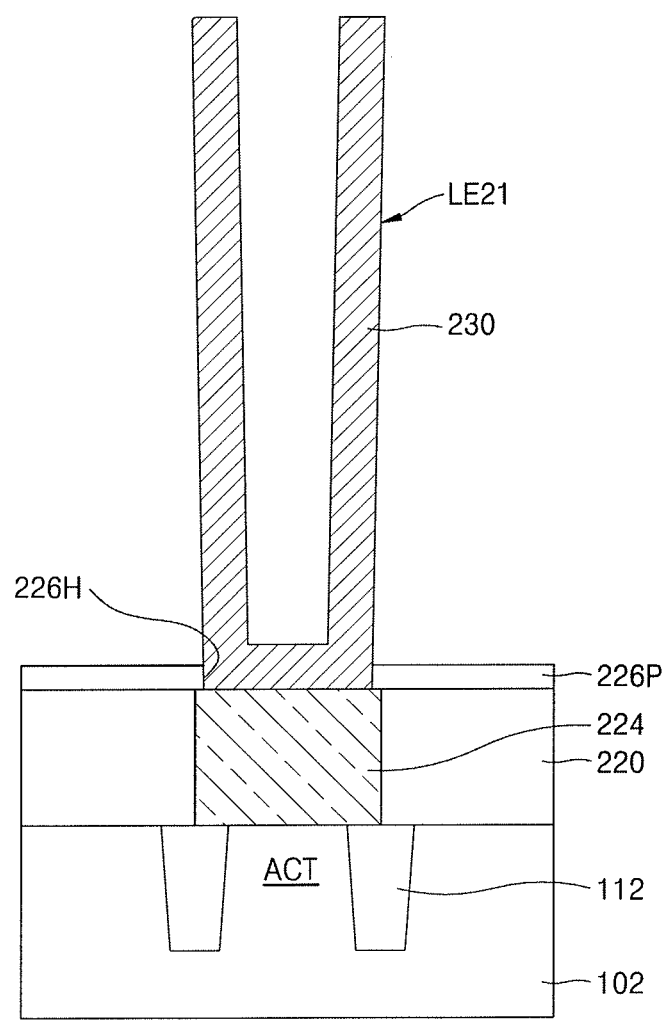

Referring to FIG. 16G, by removing the mold pattern 228P from the resultant structure of FIG. 16F, external surfaces of the cylindrical lower electrode LE21 are exposed.

Figure 16H:
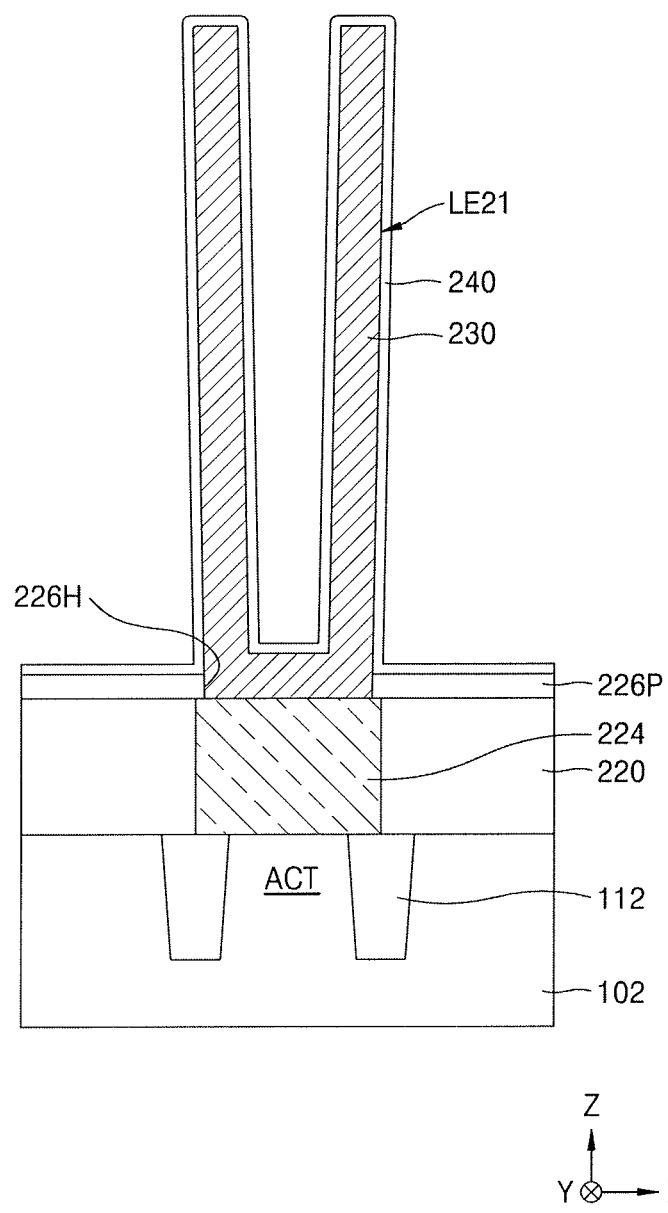

Referring to FIG. 16H, the dielectric layer 240 is formed on the lower electrode LE21.

The dielectric layer 240 may conformally cover the exposed surfaces of the lower electrode LE21. The dielectric layer 240 may be formed by an ALD process.

Referring to FIG. 16, the upper electrode UE21 is formed by forming the upper electrode layer 250 on the dielectric layer 240. In order to form the upper electrode layer 250, a chemical vapor deposition (CVD) process, a metal organic CVD (MOCVD) process, or an ALD process may be used. The capacitor C21 may be configured by the lower electrode LE21, the dielectric layer 240, and the upper electrode UE21.

FIGS. 17A to 17E are cross-sectional views illustrating processes of a method of manufacturing an integrated circuit device, according to an example embodiment. An example manufacturing method of the integrated circuit device 200B illustrated in FIGS. 9A and 9B will be described with reference to FIGS. 17A to 17E.

Figure 17A:
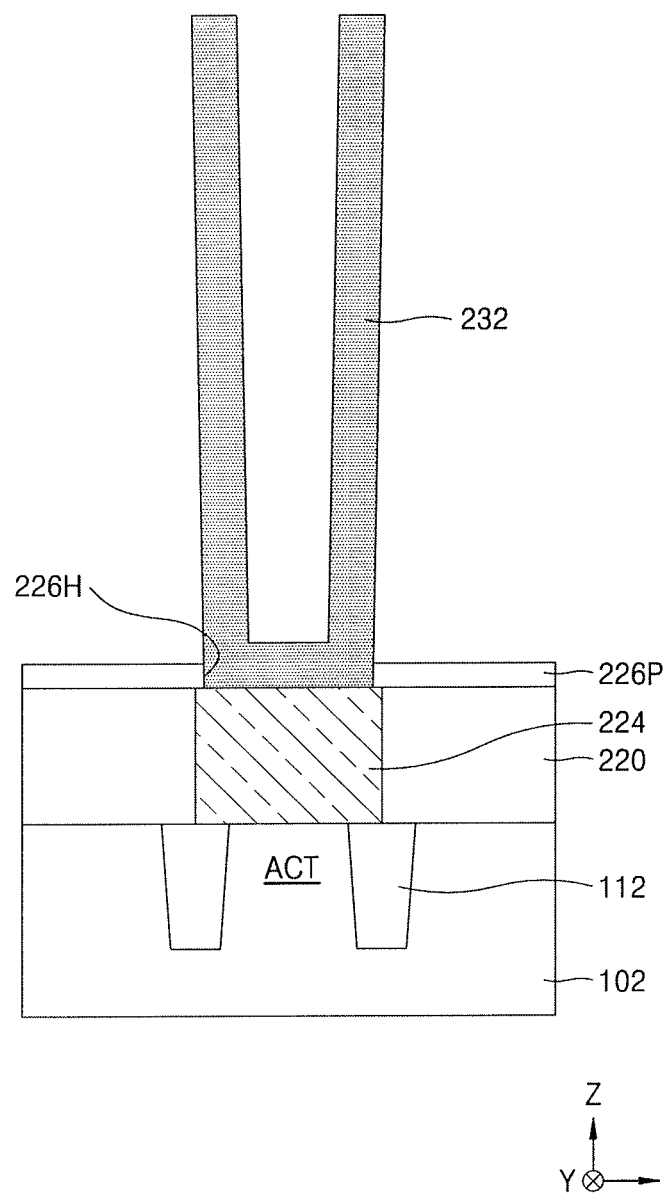
FIGS. 17A to 17E illustrate cross-sectional views of processes of a method of manufacturing an integrated circuit device, according to an example embodiment.

Referring to FIG. 17A, processes similar to those described with reference to FIGS. 16A to 16G are performed. In the current example, instead of forming the main lower electrode layer 230, the main lower electrode layer 232 is formed on the conductive region 224.

A material of the main lower electrode layer 232 is the same as described with reference to FIGS. 9A and 9B. In order to form the main lower electrode layer 232, a CVD process, a MOCVD process, or an ALD process may be used.

Figure 17B:
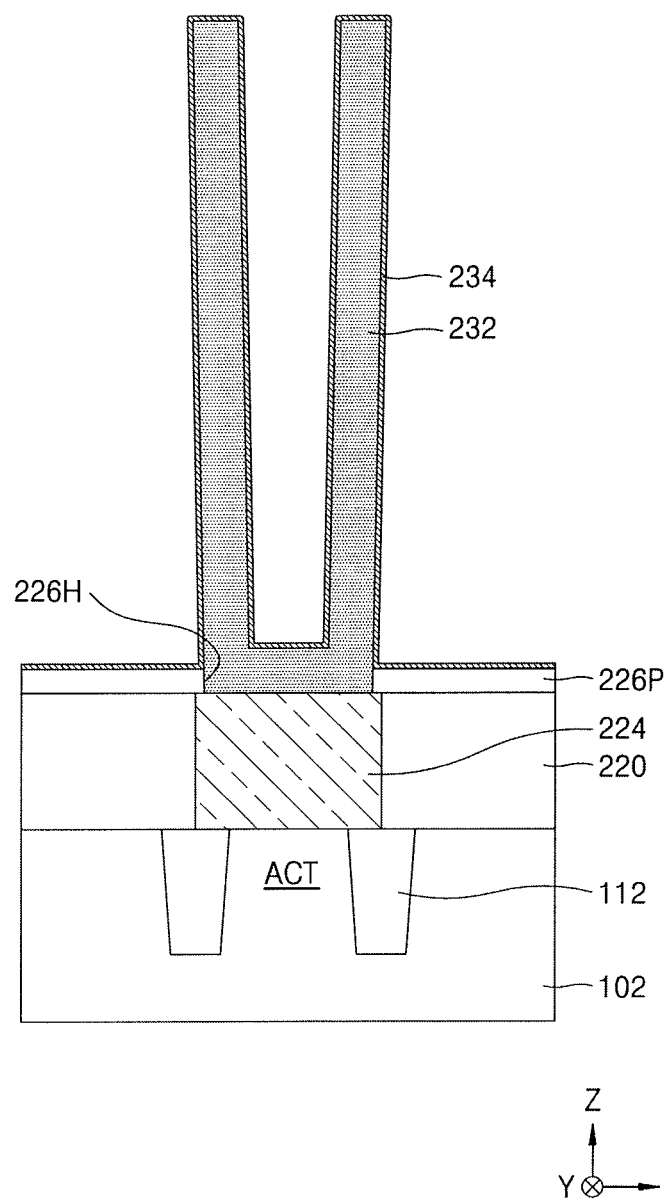

Referring to FIG. 17B, on the resultant structure of FIG. 17A, the lower interface electrode layer 234 is formed.

In an example embodiment, in order to form the lower interface electrode layer 234, first, a preliminary lower interface electrode layer that conformally covers exposed surfaces of the main lower electrode layer 232 and exposed surfaces of the insulating pattern 226P may be formed on the resultant structure of FIG. 17A. The preliminary lower interface electrode layer may include the NbO layer or the NbON layer. In order to form the preliminary lower interface electrode layer, the ALD process may be used. Then, in a state in which the preliminary lower interface electrode layer covers the main lower electrode layer 232, thermal treatment may be performed on the resultant structure in which the preliminary lower interface electrode layer is formed. The thermal treatment may be performed at a temperature in a range of about 500° C. to about 1,150° C. When the main lower electrode layer 232 is formed of TiN, while the thermal treatment is performed, Ti atoms in the main lower electrode layer 232 may be diffused into the preliminary lower interface electrode layer. As a result, the NbO layer or the NbON layer that configures the preliminary lower interface electrode layer is doped with the Ti atoms and accordingly, the lower interface electrode layer 234 formed of the Ti doped NbO layer or the Ti doped NbON layer may be obtained.

In other example embodiments, in order to form the lower interface electrode layer 234, the Ti doped NbO layer or the Ti doped NbON layer may be formed by using the ALD process. In this case, in order to form the Ti doped NbO layer or the Ti doped NbON layer, the ALD unit cycle including processes of supplying reaction materials may be performed a plurality of times. The ALD unit cycle may be similar to the ALD unit cycle described with reference to FIG. 16E, which includes the first to sixth processes. In the fifth process, instead of the reaction gas including the nitrogen atoms, a reaction gas including oxygen atoms, the nitrogen atoms, or a combination of the above atoms or a mixed gas of a reaction gas including the oxygen atoms and a reaction gas including the nitrogen atoms is supplied. In the sixth process, after performing the fifth process, unnecessary materials left on the substrate are purged and the purged materials may be discharged to the outside of the reaction chamber. The reaction gas including the oxygen atoms may be formed of O$_2$, O$_3$, H$_2$O, NO, NO$_2$, N$_2$O, CO$_2$, H$_2$O$_2$, HCOOH, CH$_3$COOH, (CH$_3$CO)$_2$O, plasma O$_2$, remote plasma O$_2$, plasma N$_2$O, plasma H$_2$O, or a combination of the above compounds. Examples of the reaction gas including the nitrogen atoms are the same as described with reference to FIG. 16E. The reaction gas including the oxygen atoms and the nitrogen atoms may be formed of NO, NO$_2$, N$_2$O, plasma N$_2$O, or a combination of the above compounds.

Figure 17C:
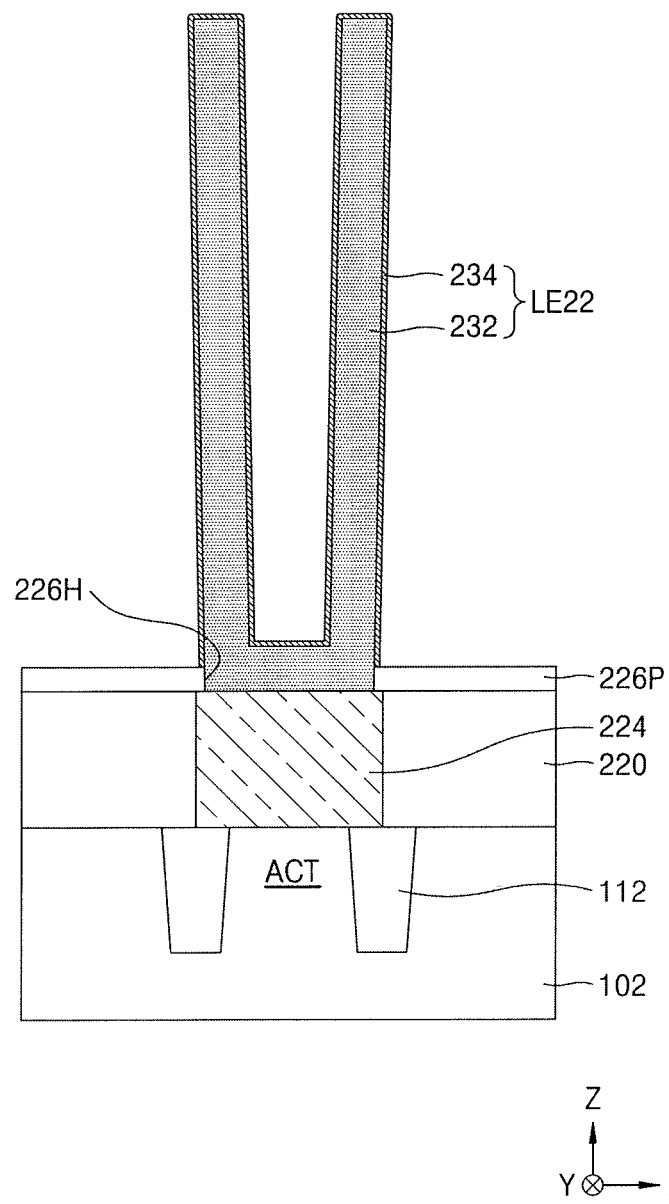

In FIG. 17B, it is illustrated that the lower interface electrode layer 234 is entirely formed on the exposed surface of the resultant structure of FIG. 17A. In another example embodiment, by forming the lower interface electrode layer 234 by using a selective ALD process, the lower interface electrode layer 234 may be formed only on the exposed surfaces of the main lower electrode layer 232. Referring to FIG. 17C, by removing a part of the lower interface electrode layer 234, in the lower interface electrode layer 234, only a portion that covers the surface of the main lower electrode layer 232 is left. After removing a part of the lower interface electrode layer 234, a top surface of the insulating pattern 226P may be exposed. When a plurality of main lower electrode layers 232 are formed on the substrate 102, as illustrated in FIG. 17C, after a part of the lower interface electrode layer 234 is removed, the lower interface electrode layer 234 may be divided into a plurality of portions that respectively cover the plurality of main lower electrode layers 232. The main lower electrode layer 232 and the lower interface electrode layer 234 left on the main lower electrode layer 232 may configure the lower electrode LE22.

Figure 17D:
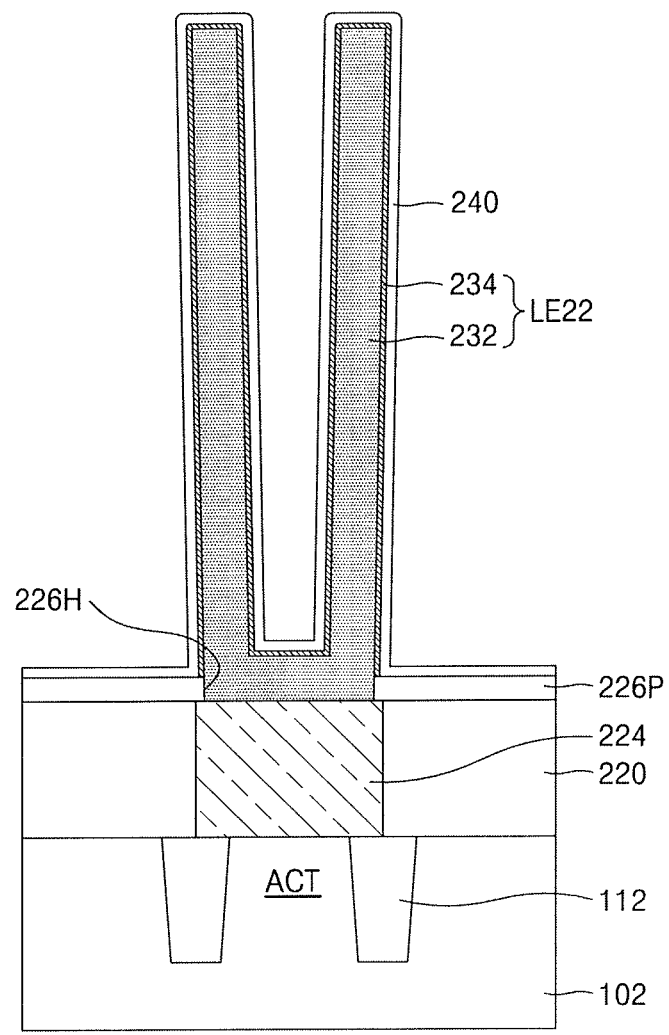

Referring to FIG. 17D, by a method similar to that described with reference to FIG. 16H, the dielectric layer 240 is formed on the lower electrode LE22.

Figure 16I:
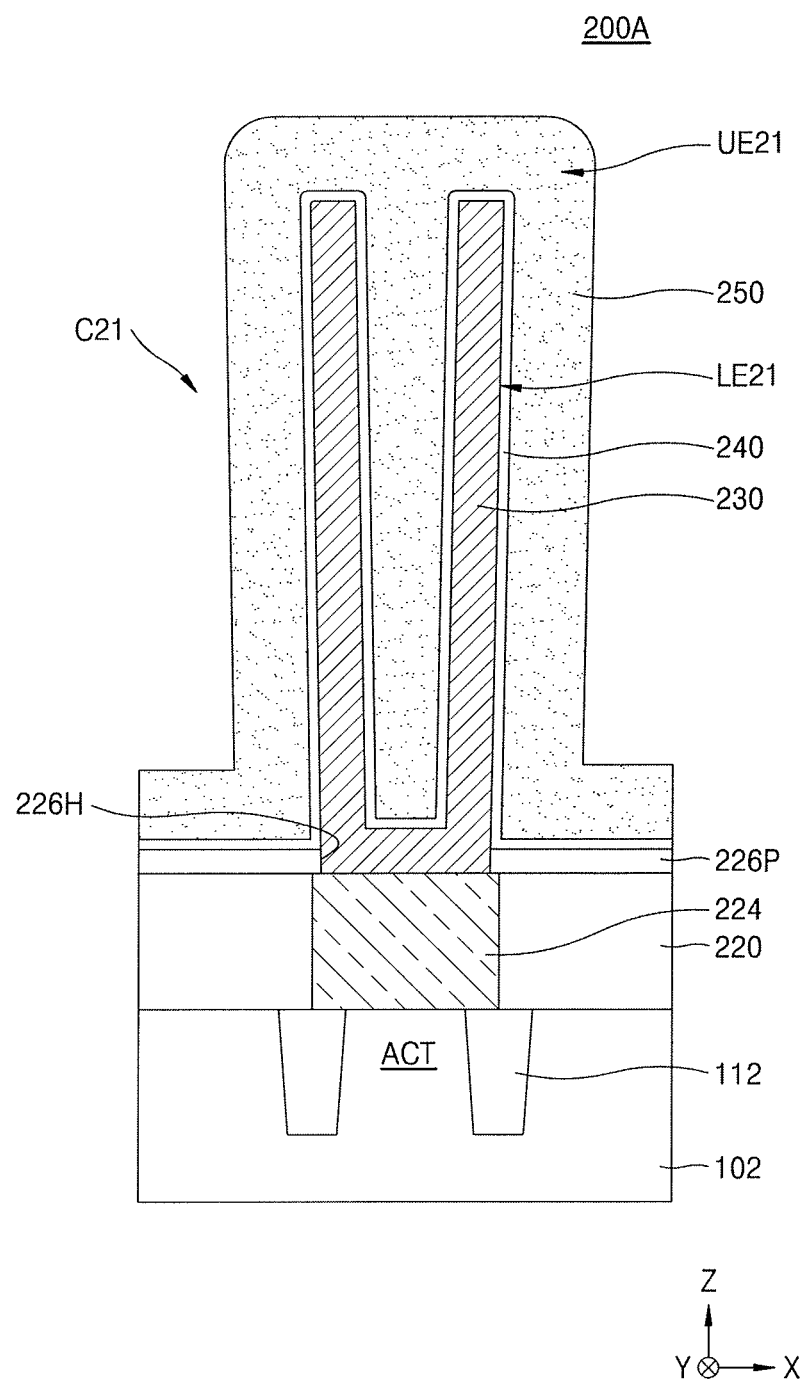
Figure 17E:
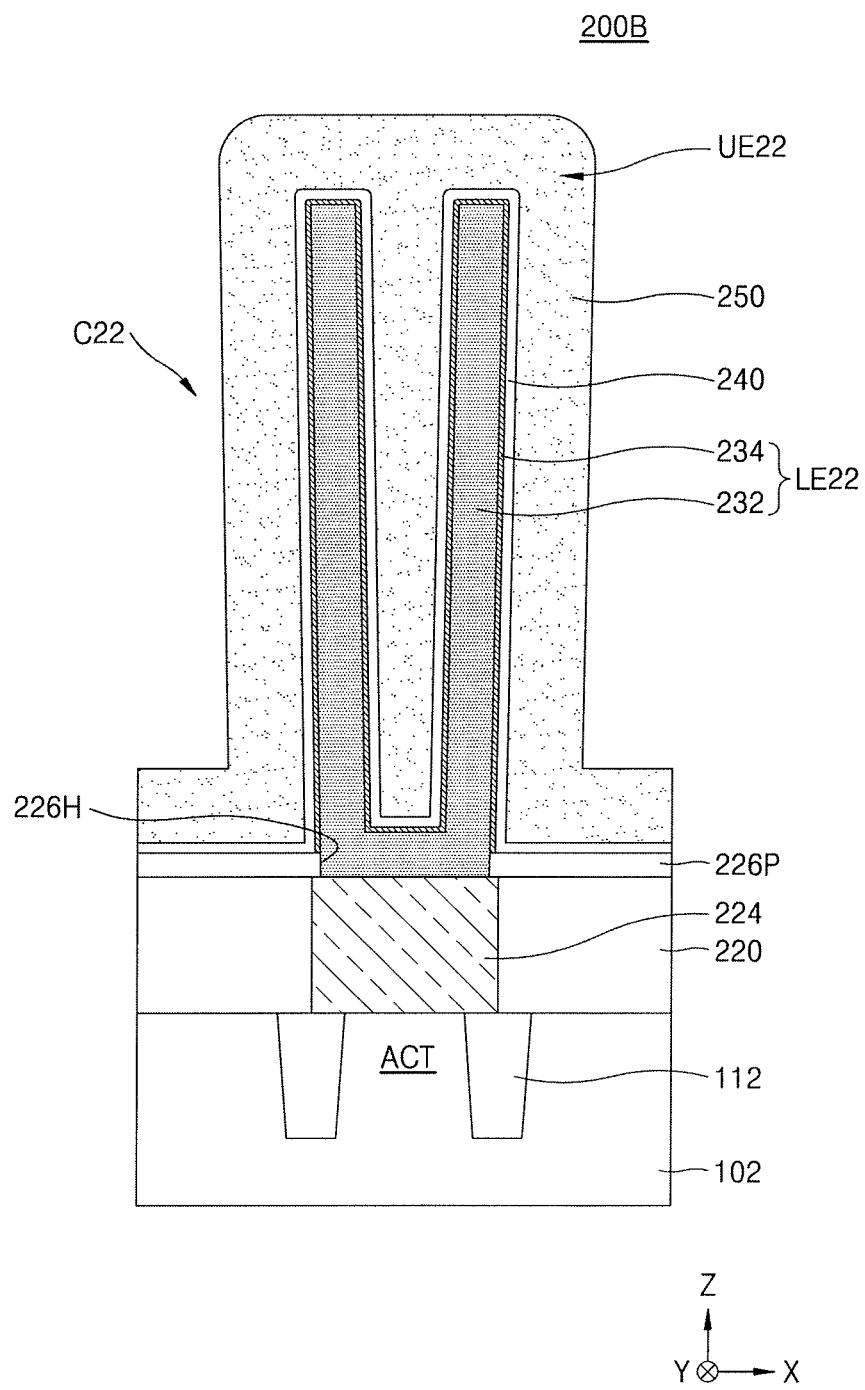

Referring to FIG. 17E, by the same method as that described with reference to FIG. 16I, the upper electrode layer 250 is formed on the dielectric layer 240 and accordingly, the upper electrode UE22 is formed. The capacitor C22 may be configured by the lower electrode LE22, the dielectric layer 240, and the upper electrode UE22.

In order to manufacture the integrated circuit devices 200C and 200D illustrated in FIGS. 10 and 11, the method described with reference to FIGS. 16A to 16I, the method described with reference to FIGS. 17A to 17E, or a method obtained by combining the above methods may be used.

In an example embodiment, in order to manufacture the integrated circuit device 200C illustrated in FIG. 10, by performing the processes described with reference to FIGS. 16A to 16G, the main lower electrode layer 230 may be formed on the conductive region 224. Then, by a method similar to that described with reference to FIGS. 17B and 17C, which includes the process of forming the lower interface electrode layer 234, the lower interface electrode layer 236 may be formed on the exposed surfaces of the main lower electrode layer 230 and the insulating pattern 226P. Then, by a method similar to that described with reference to FIG. 16H, the dielectric layer 240 may be formed on the lower interface electrode layer 236. Then, by a method similar to that described with reference to FIG. 17B, which includes the process of forming the lower interface electrode layer 234, the upper interface electrode layer 238 is formed on the dielectric layer 240 and the upper electrode layer 250 is formed on the upper interface electrode layer 238 and accordingly, the upper electrode UE23 may be formed.

In an example embodiment, in order to manufacture the integrated circuit device 200D illustrated in FIG. 11, by performing processes similar to those described with reference to FIGS. 17A to 17D, on the conductive region 224, the lower electrode LE24 including the main lower electrode layer 232 and the lower interface electrode layer 234 and the dielectric layer 240 may be formed. Then, by a method similar to that described with reference to FIG. 17B, which includes the process of forming the lower interface electrode layer 234, the upper interface electrode layer 238 is formed on the dielectric layer 240 and the upper electrode layer 250 is formed on the upper interface electrode layer 238 and accordingly, the upper electrode UE24 may be formed.

Figure 18A:
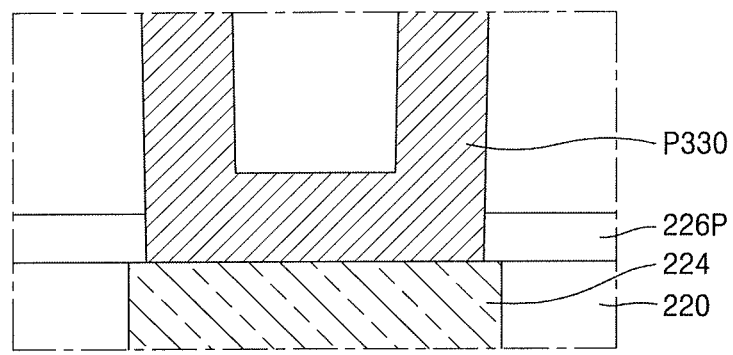
FIGS. 18A and 18B illustrate cross-sectional views of processes of a method of manufacturing an integrated circuit device, according to an example embodiment.
Figure 18B:
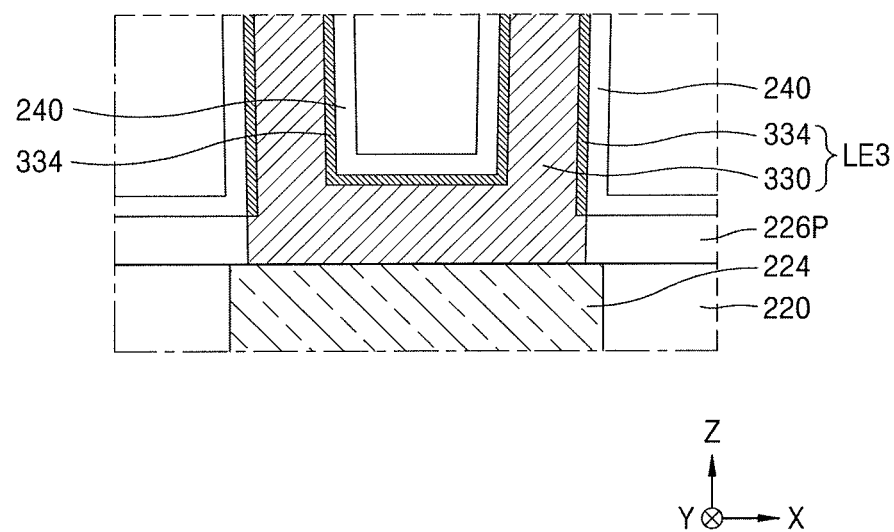

FIGS. 18A and 18B are cross-sectional views illustrating processes of a method of manufacturing an integrated circuit device, according to an example embodiment. An example manufacturing method of the integrated circuit device 300 illustrated in FIG. 12 will be described with reference to FIGS. 18A and 18B. In FIGS. 18A and 18B, cross-section configurations in the order of processes of a portion corresponding to Q1 of FIG. 8A are illustrated.

Referring to FIG. 18A, by a method similar to that described with reference to FIGS. 16A to 16G, which includes the process of forming the main lower electrode layer 230, a preliminary main lower electrode layer P330 is formed on the conductive region 224. In an example embodiment, the preliminary main lower electrode layer P330 may include the NbN layer doped with Ti.

Referring to FIG. 18B, by a method similar to that described with reference to FIG. 16H, the dielectric layer 240 is formed on exposed surfaces of the preliminary main lower electrode layer P330 and exposed surfaces of the conductive region 224. In an example embodiment, the dielectric layer 240 may be formed of a metal oxide layer. In the current example, after at least a part of the dielectric layer 240 is formed, the oxygen atoms in the dielectric layer 240 may be diffused into the preliminary main lower electrode layer P330. In an example, while the dielectric layer 240 is formed, due to a process temperature during the formation of the dielectric layer 240, the oxygen atoms in the dielectric layer 240 may be diffused into the preliminary main lower electrode layer P330. In another example, after the dielectric layer 240 is formed, additional thermal treatment is performed and accordingly, the oxygen atoms in the dielectric layer 240 may be diffused into the preliminary main lower electrode layer P330. The thermal treatment may be performed at a temperature in the range of about 500° C. to about 1,150° C. As a result, in the preliminary main lower electrode layer P330, a region adjacent to the dielectric layer 240 may be changed to the lower interface electrode layer 334 including the oxygen atoms. In an example embodiment, the main lower electrode layer 330 includes the NbN layer doped with Ti and the lower interface electrode layer 334 may be formed of the NbON layer doped with Ti. In the preliminary main lower electrode layer P330, the other portion excluding the portion changed to the lower interface electrode layer 334 may remain as the main lower electrode layer 330. The main lower electrode layer 330 and the lower interface electrode layer 334 may configure the lower electrode LE3.

Then, the upper electrode UE3 formed of the upper electrode layer 250 is formed on the dielectric layer 240 and accordingly, the integrated circuit device 300 illustrated in FIG. 12 may be manufactured.

In order to manufacture the integrated circuit device 400A illustrated in FIG. 13, the method described with reference to FIGS. 16A to 16I may be used. In the processes described with reference to FIGS. 16E to 16G, instead of the main lower electrode layer 230, the pillar-shaped main lower electrode layer 430 may be formed. Then, the processes described with reference to FIGS. 16H and 16I may be performed.

In order to manufacture the integrated circuit device 400B illustrated in FIG. 14, the method described with reference to FIGS. 17A to 17E may be used. In the process described with reference to FIG. 17A, instead of the main lower electrode layer 232, the pillar-shaped main lower electrode layer 432 may be formed. Then, the processes described with reference to FIGS. 17B to 17E may be performed.

The methods of manufacturing the integrated circuit devices 200A, 200B, 200C, 200D, 300, 400A, and 400B illustrated in FIGS. 8A to 14 are described with reference to FIGS. 16A to 18B, but it will be apparent to those skilled in the art that integrated circuit devices of various structures may be manufactured by various modifications thereto. For example, in order to manufacture the integrated circuit devices 100A, 100B, 100C, 100D, 100E, and 100F illustrated in FIGS. 1 to 6, the methods described with reference to FIGS. 16A to 18B or a method obtained by combining the methods described with reference to FIGS. 16A to 18B may be used. In particular, in order to form the lower electrode LE15 of the integrated circuit device 100E illustrated in FIG. 5, a method obtained by variously changing the process of forming the preliminary lower electrode layer 230L described with reference to FIG. 16E may be used. In addition, in order to form the multiple interface electrode layer MIL included in the lower electrode LE16 of the integrated circuit device 100F illustrated in FIG. 6, a method obtained by variously changing the process of forming the lower interface electrode layer 234 described with reference to FIG. 17B may be used.

As described above, embodiments relate to an integrated circuit device including a capacitor and a method of manufacturing the same. Embodiments may provide an integrated circuit device having a structure in which desired electrical characteristics may be maintained by providing high capacitance. Embodiments may provide a method of manufacturing an integrated circuit device having a structure in which desired electrical characteristics may be maintained by providing high capacitance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
    a substrate;
    a lower electrode including a niobium (Nb)-containing layer doped with titanium (Ti) disposed over the substrate;
    a dielectric layer disposed on the lower electrode; and
    an upper electrode disposed on the dielectric layer, wherein:
    the dielectric layer contacts an interface of the lower electrode, the interface including Ti and Nb nitride or Ti and Nb oxynitride in which a content ratio of a Ti atom to a Nb atom is 9:1 to 1:99, and
    the lower electrode includes:
        a main lower electrode layer including a Nb nitride layer doped with Ti; and
        a lower interface electrode layer between the main lower electrode layer and the dielectric layer, the lower interface electrode layer including a Nb oxynitride layer doped with Ti.

2. The integrated circuit device as claimed in claim 1, wherein:
    the lower electrode further includes:
        a multiple interface electrode layer including a plurality of lower interface electrode layers between the main lower electrode layer and the dielectric layer and having different content ratios of a Nb atom, and
        the multiple interface electrode layer includes a Nb oxynitride layer doped with Ti, and
    a content ratio of a Nb atom in each of the plurality of lower interface electrode layers gradually increases toward the dielectric layer.

3. The integrated circuit device as claimed in claim 1, wherein the upper electrode includes:
    a main upper electrode layer that is spaced apart from the dielectric layer; and
    an upper interface electrode layer between the main lower electrode layer and the dielectric layer, the upper interface electrode layer including a Nb oxide layer doped with Ti or a Nb oxynitride layer doped with Ti.

4. The integrated circuit device as claimed in claim 1, wherein:
    the main lower electrode layer includes the Nb nitride layer including a plurality of kinds of dopants, and
    the plurality of kinds of dopants include a first dopant formed of Ti and a second dopant formed of at least one selected from cobalt (Co), tin (Sn), vanadium (V), tantalum (Ta), dubnium (Db), phosphorus (P), arsenic (As), antimony (Sb), and bismuth (Bi).

5. The integrated circuit device as claimed in claim 1, wherein the lower electrode includes a plurality of lower electrode layers having different content ratios of a Nb atom, a content ratio of a Nb atom in the plurality of lower electrode layers being greatest in the lower electrode layer closest to the dielectric layer.

6. The integrated circuit device as claimed in claim 1, wherein the lower electrode includes a plurality of lower electrode layers having different content ratios of a Nb atom, provided that the lower electrode layer farthest from the dielectric layer does not include Nb.

7. The integrated circuit device as claimed in claim 1, wherein
    the main lower electrode layer is spaced apart from the dielectric layer.

8. An integrated circuit device, comprising:
    a substrate including an active region;
    a conductive region on the active region; and
    a capacitor on the conductive region, the capacitor including:
        a lower electrode including a niobium (Nb)-containing layer doped with titanium (Ti);
        a dielectric layer disposed on the lower electrode; and
        an upper electrode disposed on the dielectric layer, wherein:
    the dielectric layer contacts an interface of the lower electrode, and
    the lower electrode includes:
        a pillar-shaped main lower electrode layer that longitudinally extends in a vertical direction away from the substrate on the conductive region; and
        a lower interface electrode layer including a Nb oxynitride layer doped with Ti, the lower interface electrode layer covering an external surface of the pillar-shaped main lower electrode layer.

9. The integrated circuit device as claimed in claim 8, wherein the upper electrode includes:
    a main upper electrode layer without Nb, which is spaced apart from the dielectric layer; and
    an upper interface electrode layer between the main upper electrode layer and the dielectric layer and including a Nb oxynitride layer doped with Ti.

10. The integrated circuit device as claimed in claim 8, wherein the lower electrode further includes at least one additional dopant selected from Co, Sn, V, Ta, Db, P, As, Sb, and Bi.

11. The integrated circuit device as claimed in claim 8, wherein:
   the pillar-shaped main lower electrode layer includes a Nb nitride layer doped with Ti, and
   the dielectric layer includes a metal oxide layer.

12. The integrated circuit device as claimed in claim 8, wherein:
   the pillar-shaped main lower electrode layer is without Nb.

13. An integrated circuit device, comprising:
   a substrate including an active region;
   a conductive region on the active region; and
   a capacitor on the conductive region, the capacitor including:
      a lower electrode including at least one selected from a Nb nitride layer doped with Ti, a Nb oxide layer doped with Ti, and a Nb oxynitride layer doped with Ti;
      a dielectric layer disposed on the lower electrode and including a metal oxide layer; and
      an upper electrode disposed on the dielectric layer, wherein:
   the dielectric layer contacts an interface of the lower electrode, and
   the lower electrode includes:
      a main lower electrode layer that is spaced apart from the dielectric layer and includes TiN; and
      a lower interface electrode layer between the main lower electrode layer and the dielectric layer, the lower interface electrode layer having a top surface that contacts the dielectric layer, and including a Nb oxide layer doped with Ti or a Nb oxynitride layer doped with Ti.

* * * * *